US012402368B2

(12) United States Patent
Nabuchi et al.

(10) Patent No.: US 12,402,368 B2
(45) Date of Patent: Aug. 26, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventors: Yuta Nabuchi, Tokyo (JP); Katsumi Eikyu, Tokyo (JP); Atsushi Sakai, Tokyo (JP); Akihiro Shimomura, Tokyo (JP); Satoru Tokuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 482 days.

(21) Appl. No.: 17/887,156

(22) Filed: Aug. 12, 2022

(65) Prior Publication Data

US 2023/0118274 A1    Apr. 20, 2023

(30) Foreign Application Priority Data

Oct. 14, 2021   (JP) .................................. 2021-168912

(51) Int. Cl.
*H10D 62/10*      (2025.01)
*H01L 21/265*     (2006.01)
(Continued)

(52) U.S. Cl.
CPC ...... *H10D 62/111* (2025.01); *H01L 21/26513* (2013.01); *H10D 30/0297* (2025.01); *H10D 30/668* (2025.01); *H10D 62/393* (2025.01)

(58) Field of Classification Search
CPC .......... H01L 21/26513; H10D 30/0297; H10D 30/665; H10D 30/668; H10D 62/105; H10D 62/111; H10D 62/393; H10D 64/256
(Continued)

(56) References Cited

U.S. PATENT DOCUMENTS 11,362,207 B2      6/2022  Sakai et al.
2006/0043480 A1    3/2006  Tsuchitani et al.
(Continued)

FOREIGN PATENT DOCUMENTS

JP    2006-073740 A    3/2006
JP    2009-141185 A    6/2009
(Continued)

OTHER PUBLICATIONS

Office Action dated Dec. 24, 2024, from corresponding Japanese Patent Application No. 2021-168912, 10 pages.

*Primary Examiner* — Fazli Erdem
(74) *Attorney, Agent, or Firm* — Rimon P.C.

(57) ABSTRACT

A semiconductor device includes a cell region in which a plurality of unit cells are formed, and an outer peripheral region surrounding the cell region in plan view. Each of the plurality of unit cells includes a semiconductor substrate having a drift region, a body region, a source region, a pair of first column regions, and a gate electrode formed in a trench with a gate insulating film interposed therebetween. A well region is formed on a surface of the drift region in the outer peripheral region. A second column region is formed in the drift region below the well region and extends in Y and X directions so as to surround the cell region. The well region is connected to the body region, and the second column region is connected to the well region.

12 Claims, 23 Drawing Sheets

(51) Int. Cl.
  *H10D 30/01*    (2025.01)
  *H10D 30/66*    (2025.01)
  *H10D 62/17*    (2025.01)

(58) Field of Classification Search
  USPC .......................................................... 257/330
  See application file for complete search history.

(56) References Cited

U.S. PATENT DOCUMENTS

| | | | | |
|---|---|---|---|---|
| 2007/0052015 | A1* | 3/2007 | Miura | H01L 29/7811 |
| | | | | 257/E29.066 |
| 2011/0220992 | A1* | 9/2011 | Inomata | H01L 29/7811 |
| | | | | 257/330 |
| 2020/0411683 | A1 | 12/2020 | Kaya et al. | |

FOREIGN PATENT DOCUMENTS

| | | |
|---|---|---|
| JP | 2021-007129 A | 1/2021 |
| JP | 2021-082770 A | 5/2021 |

* cited by examiner

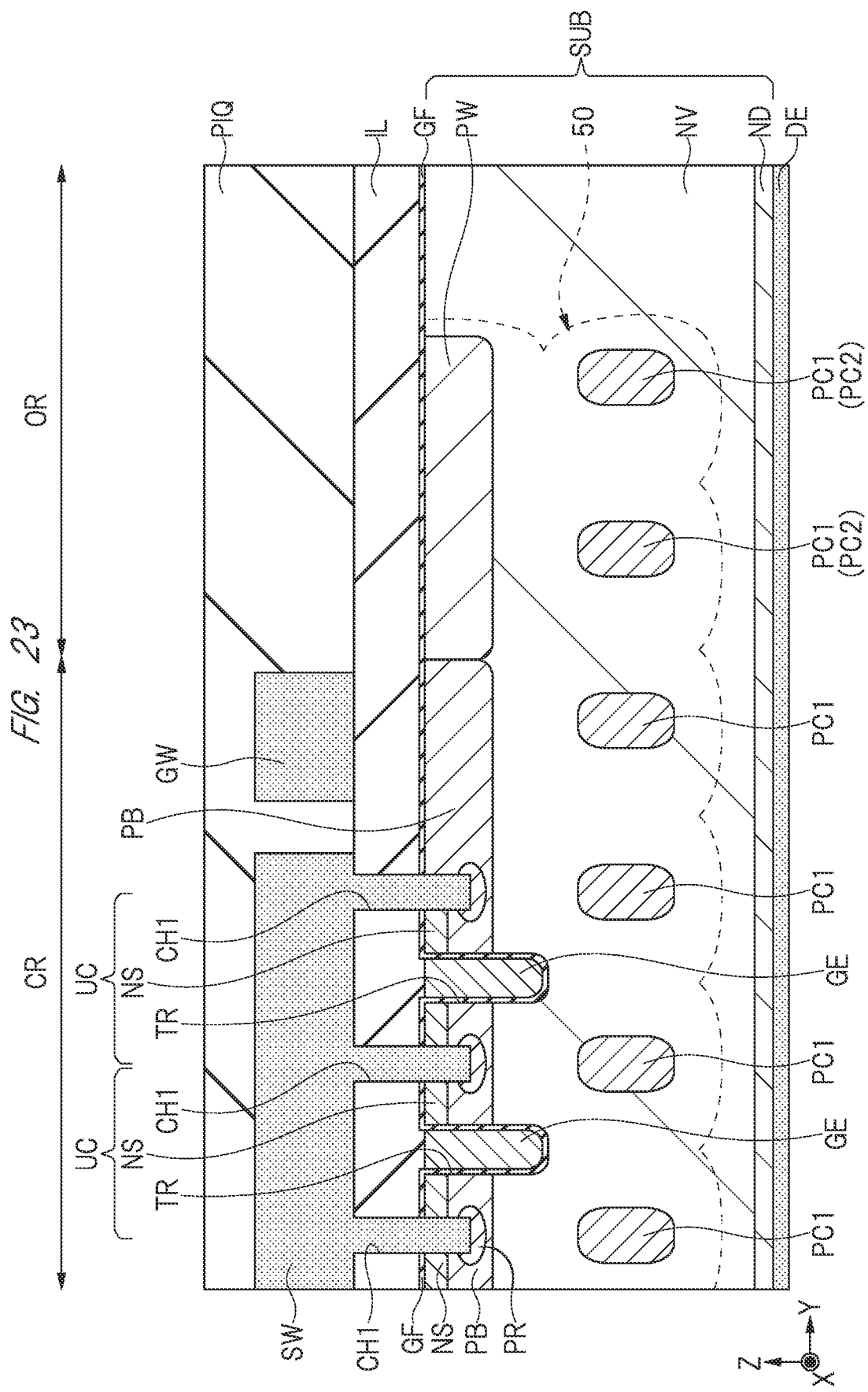

SEMICONDUCTOR DEVICE AND METHOD OF MANUFACTURING THE SAME

CROSS-REFERENCE TO RELATED APPLICATIONS

The disclosure of Japanese Patent Application No. 2021-168912 filed on Oct. 14, 2021 including the specification, drawings and abstract is incorporated herein by reference in its entirety.

BACKGROUND

The present invention relates to a semiconductor device and a method of manufacturing the same, and particularly relates to a semiconductor device having a column region below a body region, and a method of manufacturing such a semiconductor device.

In a semiconductor element such as a power MOSFET (Metal Oxide Semiconductor Field Effect Transistor), there is a PN junction structure called a super junction structure (SJ structure) as a structure for improving breakdown voltage. In a case of an n-type MOSFET, a p-type column region is arranged two-dimensionally in an n-type drift region such that depletion occurs around the p-type column region, thereby improving breakdown voltage.

There are disclosed techniques listed below.
[Patent Document 1] Japanese Unexamined Patent Application Publication No. 2021-7129

For example, Patent Document 1 discloses a multi-trench SJ structure having a pair of trench gates per unit cell. In such a multi-trench SJ structure, a plurality of column regions are formed at the same pitch at a boundary of each of the unit cells. However, Patent Document 1 fails to disclose an arrangement of the column regions in the outer peripheral region surrounding each of the unit cells.

SUMMARY

In the semiconductor device equipped with the power MOSFET, various impurity regions and the like are formed in the outer peripheral region surrounding each of the unit cells in order to ensure breakdown voltage. In a case of the power MOSFET having the SJ structure, it is necessary to make an improvement to ensure breakdown voltage in the outer peripheral region. However, Patent Document 1 fails to disclose such an improvement.

A main object of the present application is to ensure breakdown voltage in the outer peripheral region and thus to ensure reliability of the semiconductor device. Other issues and novel features will become apparent from the description in the present specification and accompanying drawings.

The following is a brief overview of a representative embodiment disclosed in the present application.

A semiconductor device according to one embodiment includes a cell region in which a plurality of unit cells are formed, and an outer peripheral region surrounding the cell region in plan view. Each of the plurality of unit cells comprises: a semiconductor substrate having a drift region made of a semiconductor layer of a first conductivity type; a body region of a second conductivity type opposite to the first conductivity type, the body region being formed on a surface of the drift region in the cell region; a source region of the first conductivity type formed on a surface of the body region; a pair of first column regions of the second conductivity type formed in the drift region below the body region so as to be physically separated from the body region, the pair of first column regions being apart from and adjacent to each other in a first direction in plan view; a trench formed in the drift region such that a bottom portion of the trench reaches a position deeper than the body region, the trench being formed between the pair of first column regions in the first direction; and a gate electrode formed in the trench with a gate insulating film interposed therebetween. Here, a first impurity region of the second conductivity type is formed on a surface of the drift region in the outer peripheral region, a second column region of the second conductivity type is formed in the drift region below the first impurity region, the second column region extending in the first direction and in a second direction intersecting the first direction in plan view so as to surround the cell region, the first impurity region is connected to the body region, and the second column region is connected to the first impurity region.

A method of manufacturing a semiconductor device according to one embodiment, in which the semiconductor device includes a cell region in which a plurality of unit cells are formed and an outer peripheral region surrounding the cell region in plan view, includes: (a) a step of preparing a semiconductor substrate having a drift region made of a semiconductor layer of a first conductivity type; (b) a step of forming a trench in the drift region in the cell region; (c) a step of forming a pair of first column regions of a second conductivity type opposite to the first conductivity type, the pair of first column regions being formed in the drift region in the cell region so as to be apart from and adjacent to each other in a first direction in plan view; (d) a step of forming a second column region of the second conductivity type in the drift region in the outer peripheral region, the second column region extending in the first direction and in a second direction intersecting the first direction in plan view so as to surround the cell region; (e) a step of forming a gate electrode in the trench with a gate insulating film interposed therebetween; (f) a step of forming a body region of the second conductivity type on a surface of the drift region in the cell region; (g) a step of forming a source region of the first conductivity type on a surface of the body region; and (h) a step of forming a first impurity region of the second conductivity type on a surface of the drift region in the outer peripheral region. Here, the trench is formed between the pair of first column regions in the first direction, a bottom portion of the trench reaches a position deeper than the body region, and each of the plurality of unit cells comprises the semiconductor substrate, the drift region, the trench, the pair of first column regions, the gate insulating film, the gate electrode, the body region, and the source region. The pair of first column regions is formed in the drift region below the body region so as to be physically separated from the body region, the first impurity region is connected to the body region, and the second column region is formed in the drift region below the first impurity region and is connected to the first impurity region.

According to the embodiments, it is possible to ensure reliability of the semiconductor device.

BRIEF DESCRIPTION OF THE DRAWINGS

FIG. 23 is a cross-sectional view of a semiconductor device according to a studied example.

DETAILED DESCRIPTION

Hereinafter, embodiments of the present invention will be described in detail with reference to the drawings. Note that, in all of the drawings used to describe the embodiments, members having the same function are denoted by the same reference sign, and redundant descriptions thereof are omitted as appropriate. In addition, in the embodiments described below, descriptions of the same or similar portions are generally not repeated unless otherwise necessary.

In addition, X, Y, and Z directions described in the present application intersect one another and are orthogonal to one another. In the present application, the Z direction is described as a vertical direction, a height direction, or a thickness direction of a certain structure. In addition, expressions such as "plan view" used in the present application mean that a plane constituted by the X and Y directions is a "plane" and that this "plane" is viewed from the Z direction.

First Embodiment

Figure 1:
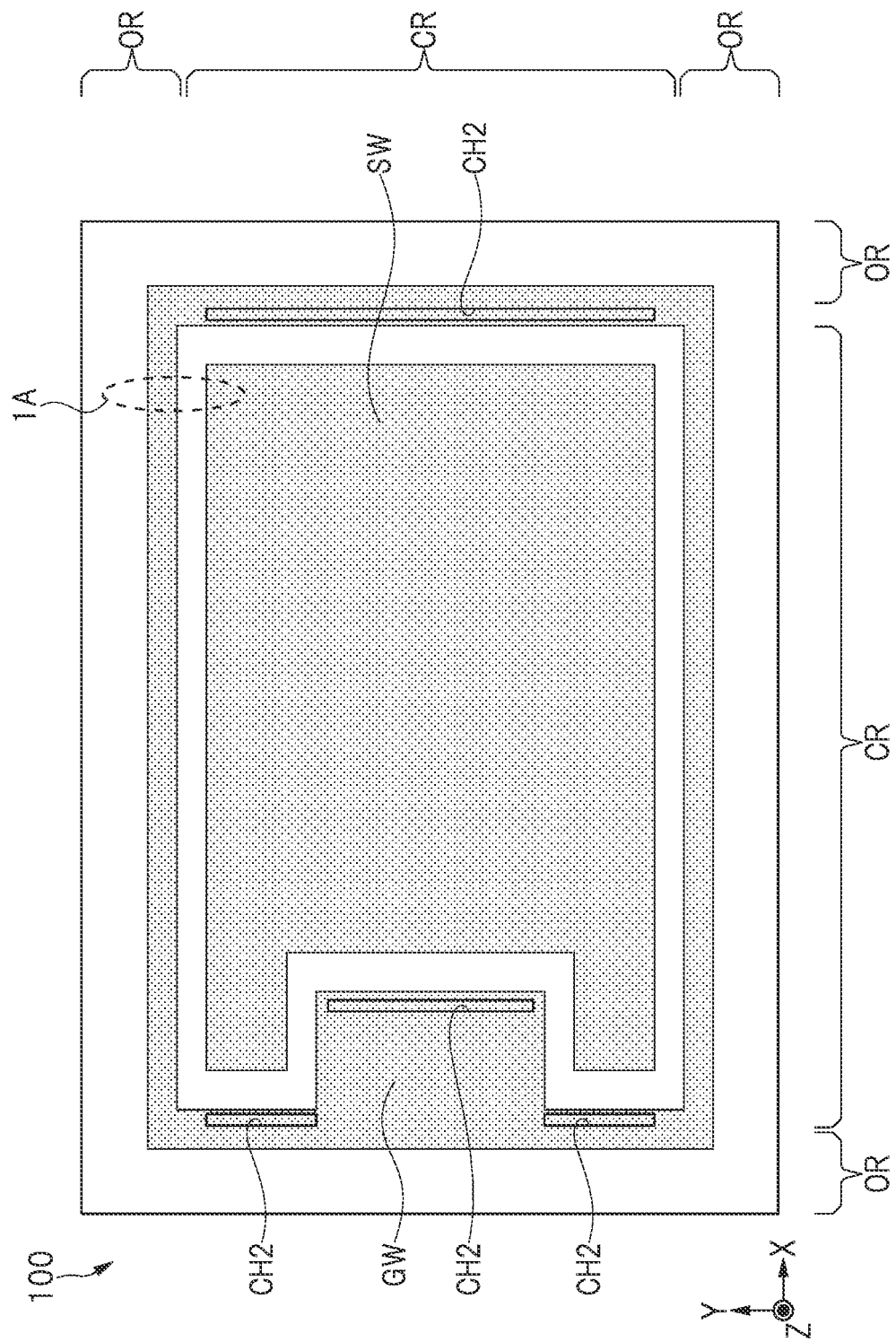
FIG. 1 is a plan view of a semiconductor device according to a first embodiment.
Figure 2:
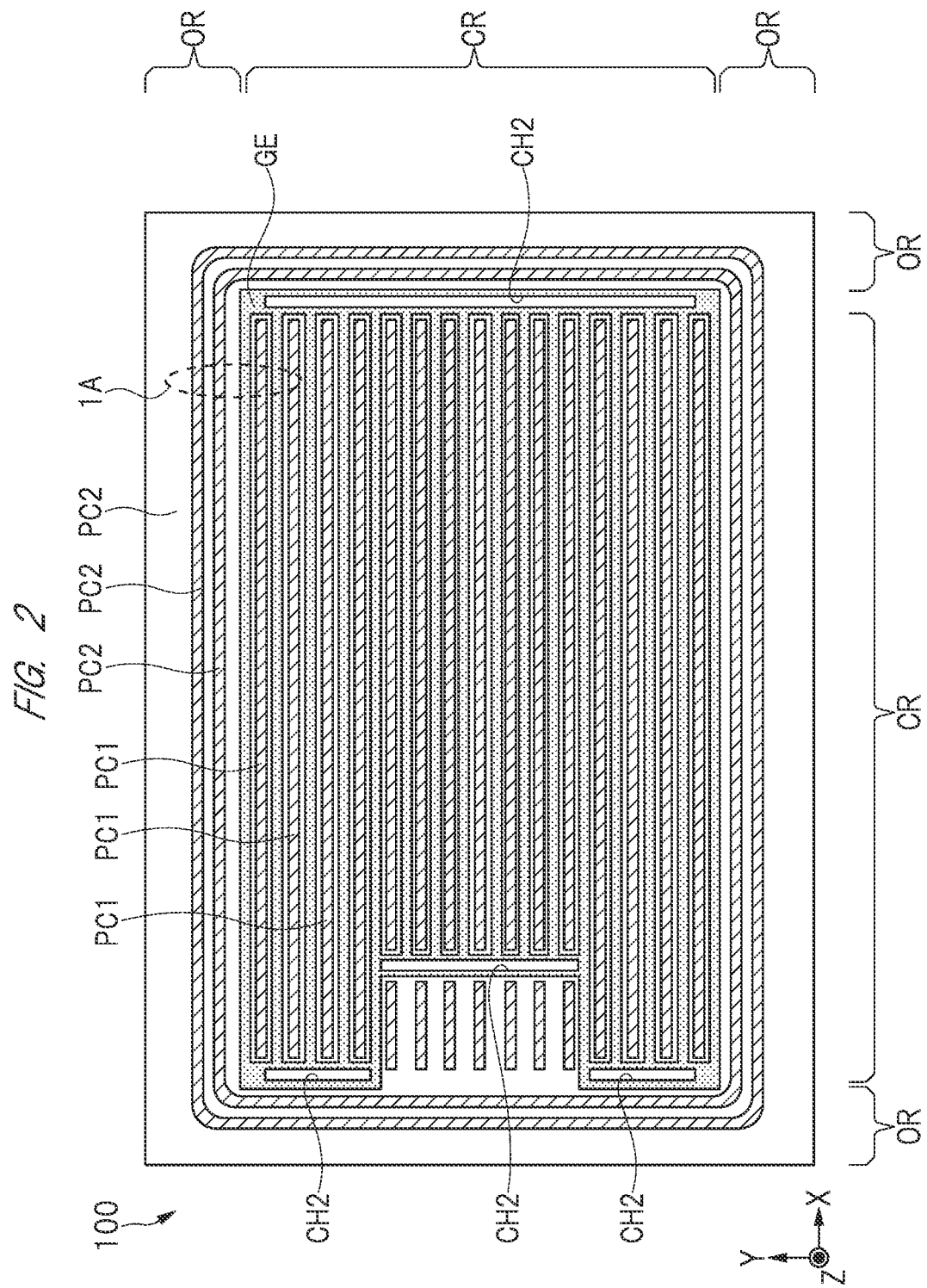
FIG. 2 is a plan view of the semiconductor device according to the first embodiment.

FIGS. 1 and 2 are plan views of a semiconductor chip which is a semiconductor device 100. FIG. 1 shows a wiring mainly formed on a semiconductor substrate SUB. FIG. 2 shows a structure below the wiring, and shows a structure formed in the vicinity of a surface of the semiconductor substrate SUB.

As shown in FIG. 1, most of the semiconductor device 100 is covered by a source wiring SW, and a gate wiring GW is formed on an outer periphery of the source wiring SW. Although not shown here, the source wiring SW and the gate wiring GW are covered by a protective film PIQ. An opening is provided in a portion of the protective film PIQ, and the source wiring SW and the gate wiring GW exposed from this opening respectively serve as a source pad and a gate pad. An external connection terminal such as a wire bonding or a clip (copper plate) is connected to the source pad and the gate pad such that the semiconductor device 100 is electrically connected to another chip, a wiring substrate, or the like.

In addition, the semiconductor device 100 includes a cell region CR, and an outer peripheral region OR surrounding the cell region CR in plan view. The cell region CR is a region in which a main transistor such as an SJ-structure power MOSFET is formed as a unit cell UC.

As shown in FIG. 2, in the cell region CR, a plurality of gate electrodes GE extend in the X direction. A gate lead portion connecting the plurality of gate electrodes GE is formed in the vicinity of a boundary between the outer peripheral region OR and the cell region CR. A hole CH2 is provided above the gate lead portion, and a portion of the gate wiring GW is embedded in the hole CH2 such that the gate wiring GW and the plurality of gate electrodes GE are electrically connected.

In addition, in the cell region CR, a plurality of p-type column regions PC1 extending in the X direction are formed between the plurality of gate electrodes GE. In the outer peripheral region OR, a plurality of p-type column regions PC2 extending in the X and Y directions are formed so as to surround the cell region CR. Here, a case where the cell region CR is surrounded by two column regions PC2 will be described. However, the number of column regions PC2 is not limited to two, and may be three or more.

<Considerations by the Present Inventors>

Hereinafter, the semiconductor device of an example studied by the present inventors and its problems will be described with reference to FIG. 23. FIG. 23 is a cross-sectional view corresponding to an enlarged area 1A shown in FIGS. 1 and 2.

As shown in FIG. 23, the semiconductor device of the studied example includes a plurality of unit cells UC in the cell region CR. Each of the unit cells UC comprises the semiconductor substrate SUB having an n-type drift region NV, a p-type body region PB formed on a surface of the drift region NV, an n-type source region formed on a surface of the body region PB, the pair of p-type column regions PC1 formed in the drift region NV so as to be located below the body region PB, a trench TR formed in the drift region NV, and the gate electrode GE formed in the trench TR with a gate insulating film GF interposed therebetween. In addition, an n-type drain region ND and a drain electrode DE are formed on a rear surface of the semiconductor substrate SUB.

In addition, in each of the unit cells UC, an interlayer insulating film IL is formed on the semiconductor substrate SUB, and a hole CH1 is formed in the interlayer insulating film IL. The source wiring SW is formed on the interlayer insulating film IL so as to fill the hole CH1. In addition, in a bottom portion of the hole CH1, a high concentration region PR having a higher impurity concentration than the body region PB is formed in the body region PB.

In the cell region CR, the plurality of column regions PC1 are formed at the same pitch in the X direction and at a boundary of each of the unit cells UC. In addition, in the outer peripheral region OR, the column regions PC1 equivalent to the column regions PC1 in the cell region CR are formed at the same pitch. Note that the column region PC1 in the outer peripheral region OR is described as the column region PC2 in order to distinguish it from the column region PC1 in the cell region CR.

In addition, a p-type well region PW is formed in the outer peripheral region OR. The p-type well region PW and the column region PC2 are provided to ensure breakdown voltage of the semiconductor device. At the time of an ON operation of the unit cell UC, a depletion layer 50 spreads as shown by a dashed line in FIG. 23. In the cell region CR, the plurality of column regions PC1 are arranged so as to be equally spaced from one another, and thus, the spreading of the depletion layer 50 is sufficient. However, in the outer peripheral region OR, the column region PC2 is physically separated from the well region PW, causing a problem in which the spreading of the depletion layer 50 is insufficient. Specifically, there is a problem in which the spreading of the depletion layer 50 in the X direction is insufficient. In other words, in the studied example, it was found that reliability of the semiconductor device may be degraded.

<Structure of Semiconductor Device According to First Embodiment>

Figure 3:
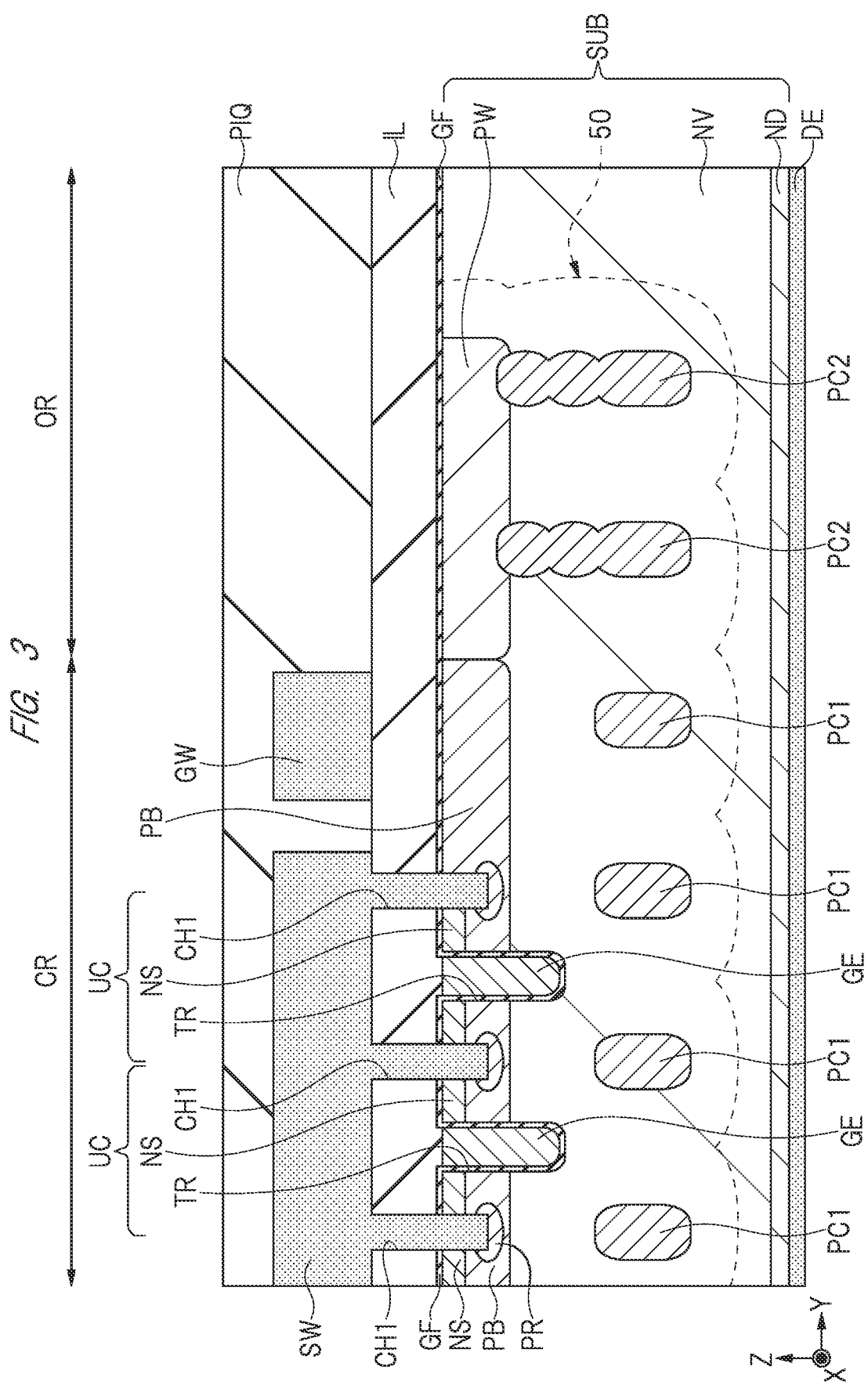
FIG. 3 is a cross-sectional view of the semiconductor device according to the first embodiment.

The present inventors have devised a semiconductor device 100 according to a first embodiment in view of the problems faced by the above-described studied example. Hereinafter, the semiconductor device 100 according to the first embodiment will be described with reference to FIG. 3. FIG. 3 is a cross-sectional view corresponding to the enlarged area 1A shown in FIGS. 1 and 2.

As shown in FIG. 3 and as in the studied example, the semiconductor device 100 of the first embodiment includes the plurality of unit cells UC in the cell region CR. Each of the unit cells UC constitutes an SJ structure. First, the structure of each of the unit cells UC in the cell region CR will be described.

The semiconductor substrate SUB is made of, for example, an n-type silicon, and has the drift region NV made of an n-type semiconductor layer. The p-type body region is formed on the surface of the drift region NV. The n-type source region NS is formed on the surface of the body region PB. The source region NS has a higher impurity concentration than the drift region NV.

The pair of column regions PC1 is formed in the drift region NV so as to be located below the body region PB. The column regions PC1 extend in the X direction, are apart from and adjacent to each other in the Y direction, and are physically separated from the body region PB in the Z direction. Note that the pair of column regions PC1 has a higher impurity concentration than the body region PB.

The trench TR is formed in the drift region NV such that a bottom portion of the trench TR reaches a position deeper than the body region PB. The trench TR extends in the X direction, and is formed between the pair of column regions PC1 in the Y direction. The gate electrode GE is formed in the trench TR with the gate insulating film OF interposed therebetween. The gate insulating film GF is, for example, a silicon oxide film, and the gate electrode GE is, for example, an n-type polysilicon film.

In addition, the n-type drain region ND and the drain electrode DE are formed on the rear surface of the semiconductor substrate SUB. The n-type drain region ND has a higher impurity concentration than the drift region NV. The drain electrode DE is made of, for example, a single layer of a metal film such as an aluminum film, a titanium film, a nickel film, a gold film, or a silver film, or is made of a stacked film in which these metal films are stacked as necessary.

The interlayer insulating film IL is formed on the semiconductor substrate SUB so as to cover the gate electrode GE. The interlayer insulating film IL is, for example, a silicon oxide film. The plurality of holes CH1 are formed in the interlayer insulating film IL. The plurality of holes CH1 penetrate the interlayer insulating film IL and the source region NS such that the bottom portion of each of the holes CH1 is located in the body region PB. The plurality of holes CH1 are provided at positions overlapping the pair of column regions PC1 in plan view, and extend in the X direction. In addition, in the bottom portion of each of the plurality of holes CH1, the high concentration region PR having a higher impurity concentration than the body region PB is formed in the body region PB. Although not shown here, a plurality of holes CH2 are also formed in the interlayer insulating film IL.

The source wiring SW is formed on the interlayer insulating film IL so as to fill the plurality of holes CH1. The source wiring SW is electrically connected to the source region NS, the body region PB, and the high concentration region PR, and supplies a source potential to these regions. The protective film PIQ such as a polyimide film is formed on the source wiring SW. Note that the gate wiring GW is also formed on the interlayer insulating film IL. Although not shown here, the gate wiring GW is embedded in the hole CH2 and is electrically connected to the gate electrode GE. A gate potential is applied from the gate wiring GW to the gate electrode GE. The source wiring SW and the gate wiring GW are made of, for example, a barrier metal film and a conductive film formed on the barrier metal film. The barrier metal film is, for example, a titanium nitride film, and the conductive film is, for example, an aluminum film.

Note that the source wiring SW and the gate wiring GW may be made of a plug layer that fills the hole CH1 or the hole CH2, and the barrier metal film and the conductive film formed on the interlayer insulating film IL. In this case, the plug layer is made of a barrier metal film such as a titanium nitride film, and a conductive film such as a tungsten film.

The semiconductor device 100 can be applied to, for example, a high-side MOSFET and a low-side MOSFET included in a DC/DC converter. In addition, in a case where the DC/DC converter is used as a motor drive circuit, the low-side MOSFET can be used as a diode by shorting the gate electrode GE to the source wiring SW. Here, an electromotive force generated from a motor (inductance) causes a voltage Vds to be applied between a source and a drain of the MOSFET for the diode, an output capacitance to change, and a reverse recovery current to be generated. When the output capacitance is highly dependent on the voltage Vds, the reverse recovery current is generated rapidly and appears as noise. In order to reduce this noise, it can be considered to provide a snubber circuit (MIM capacitor) or the like. However, the snubber circuit would limit the high-speed operation of the MOSFET.

Here, the column region PC1 of the first embodiment is physically separated from the body region PB. Therefore, no source potential is applied to the pair of column regions PC1, and the pair of column regions PC1 has a floating structure. In the case of the floating structure, the depletion layer generated from the column region PC1 and the body region PB are separated during a thermal equilibrium state (voltage Vds=0V). Therefore, compared to a case where the column region PC1 is physically connected to the body region PB, a rapid change in the output capacitance at the time of a positive bias (voltage Vds>0V) can be mitigated. Thus, noise can be reduced without providing a snubber circuit.

The p-type well region (impurity region) PW is formed on the surface of the drift region NV in the outer peripheral region OR. The well region PW is connected to the body region PB. In addition, the plurality of column regions PC2 are formed in the drift region NV below the well region PW. Note that an impurity concentration of the well region PW is lower than the impurity concentration of the body region PB, and the impurity concentration of each of the column regions PC1 and PC2 is higher than the impurity concentration of each of the well region PW and the body region PB.

As in the example studied in the first embodiment, the plurality of column regions PC1 and PC2 are arranged so as to be equally spaced from one another. In the studied example, a thickness of the column region PC2 is the same as a thickness of the column region PC1, whereas in the first embodiment, the thickness of the column region PC2 is thicker than the thickness of the column region PC1. Therefore, the plurality of column regions PC2 are connected to the well region PW. In other words, the plurality of column regions PC2 are electrically connected to the source wiring SW via the body region PB and the well region PW. Thus, the source potential from the source wiring SW is applied to the plurality of column regions PC2 via the body region PB and the well region PW.

At the time of the ON operation of the unit cell UC, the spreading of the depletion layer 50 is sufficient, as shown by a dashed line in FIG. 3. Therefore, it is possible to ensure breakdown voltage in the outer peripheral region OR, whereby it is possible to ensure reliability of the semiconductor device 100.

Note that all of the plurality of column regions PC2 need not be thicker than the thickness of the column region PC1 and need not be connected to the well region PW. However, it is necessary that the outermost column region PC2 among the plurality of column regions PC2 is formed so as to be thicker than the thickness of the column region PC1 and is connected to the well region PW. Note that the outermost column region PC2 is the column region PC2 located farthest from the cell region CR, and is the column region PC2 closest to an end of the semiconductor device 100 (end of the semiconductor chip).

<Method of Manufacturing Semiconductor Device>

Hereinafter, a method of manufacturing the semiconductor device 100 according to the first embodiment will be described with reference to FIGS. 4 to 12. As in FIG. 3, FIGS. 4 to 12 are cross-sectional views corresponding to the enlarged area 1A shown in FIGS. 1 and 2.

Figure 4:
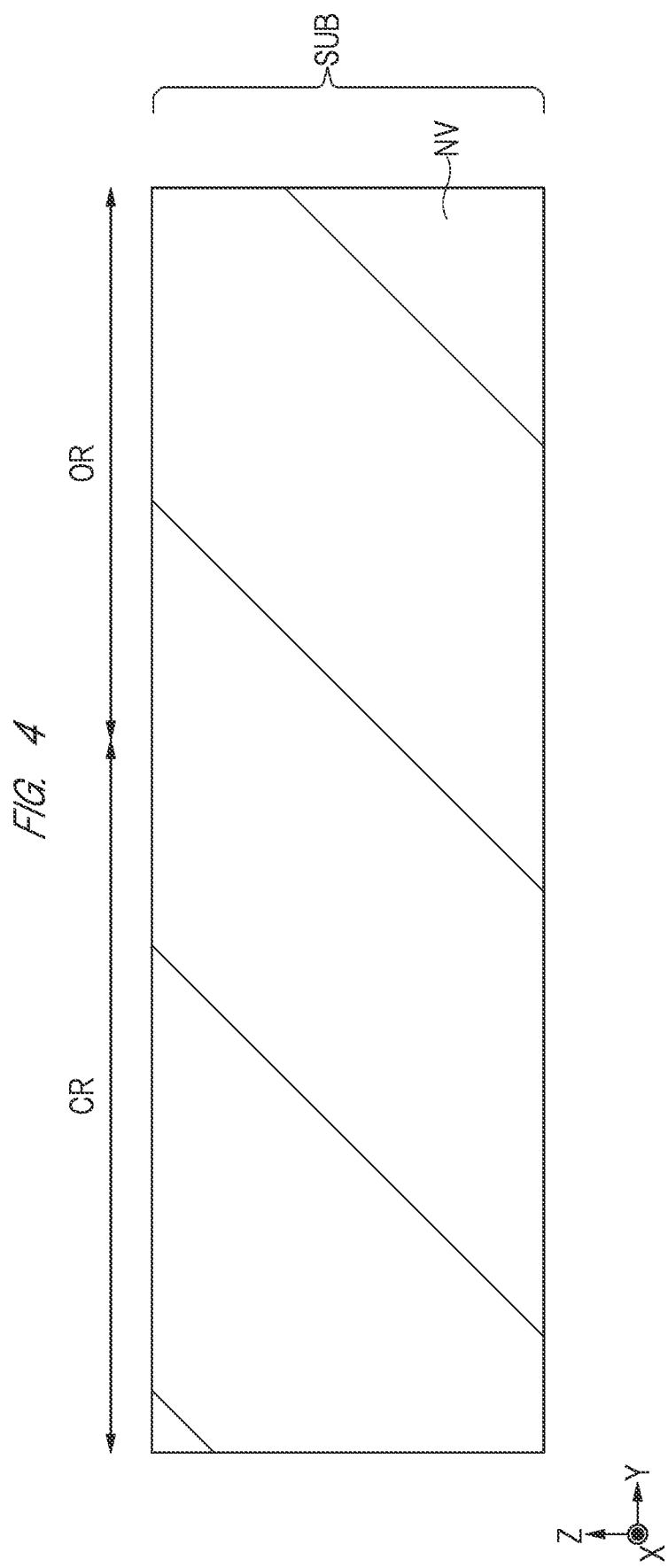
FIG. 4 is a cross-sectional view of the semiconductor device according to the first embodiment in a manufacturing process.

First, as shown in FIG. 4, the semiconductor substrate SUB having the drift region NV made of an n-type semiconductor layer is prepared. The drift region NV can be formed by, for example, growing a silicon layer on an n-type silicon substrate while introducing phosphorus (P) by an epitaxial growth method.

Figure 5:
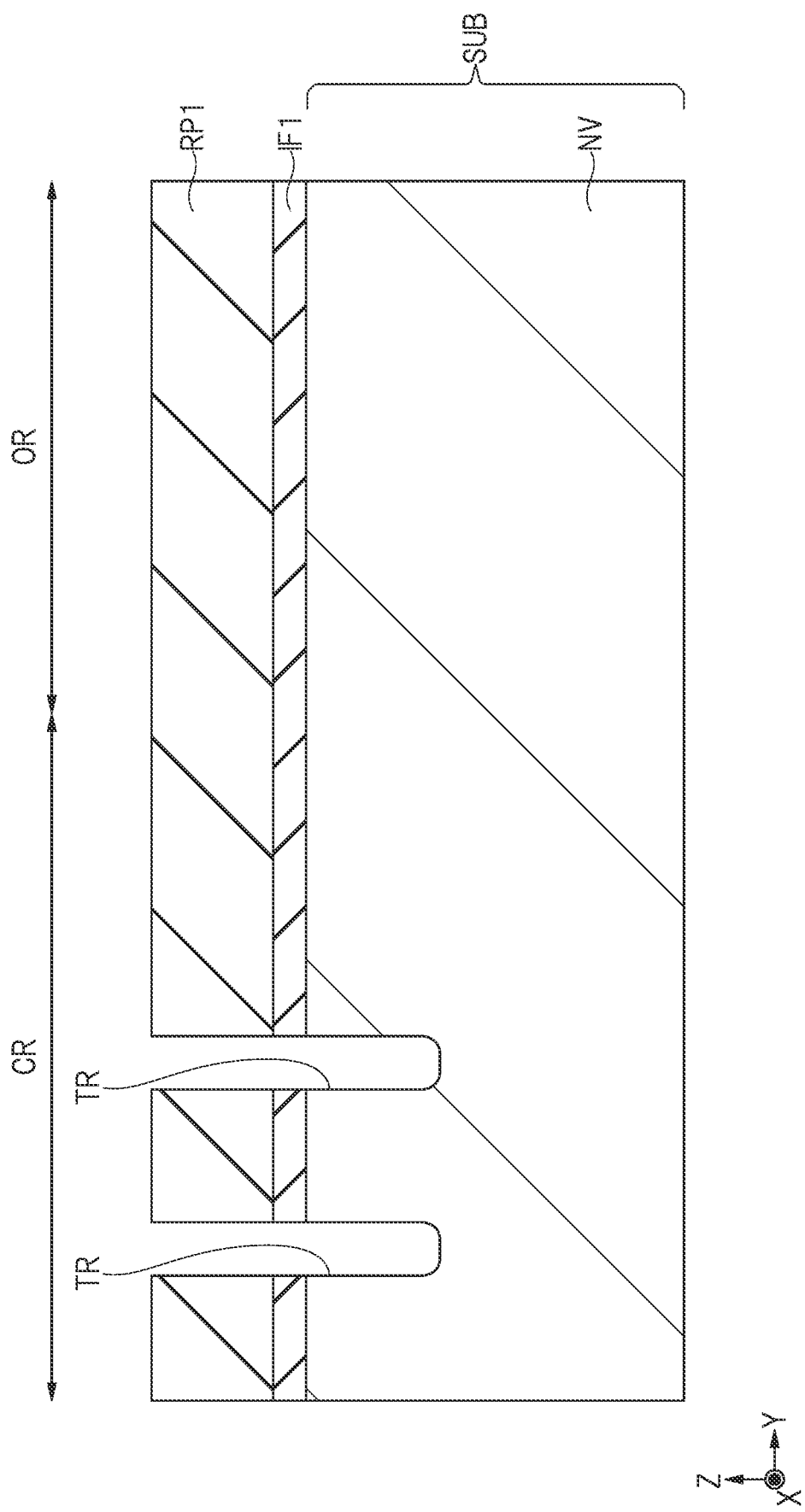
FIG. 5 is a cross-sectional view of the semiconductor device in the manufacturing process continued from FIG. 4.

As shown in FIG. 5, the trench TR is formed in the drift region NV in the cell region CR. First, an insulating film IF1 made of, for example, a silicon oxide film is formed on the semiconductor substrate SUB by, for example, a CVD method. Next, a resist pattern RP1 having an opening is formed on the insulating film IF1 by a photolithography method. Next, a dry etching process is performed on the insulating film IF1 and the drift region NV exposed from the opening using the resist pattern RP1 as a mask to form the trench TR in the drift region NV. Subsequently, the resist pattern RP1 is removed by an ashing process, and the insulating film IF1 is removed by a wet etching process using, for example, hydrofluoric acid.

Figure 6:
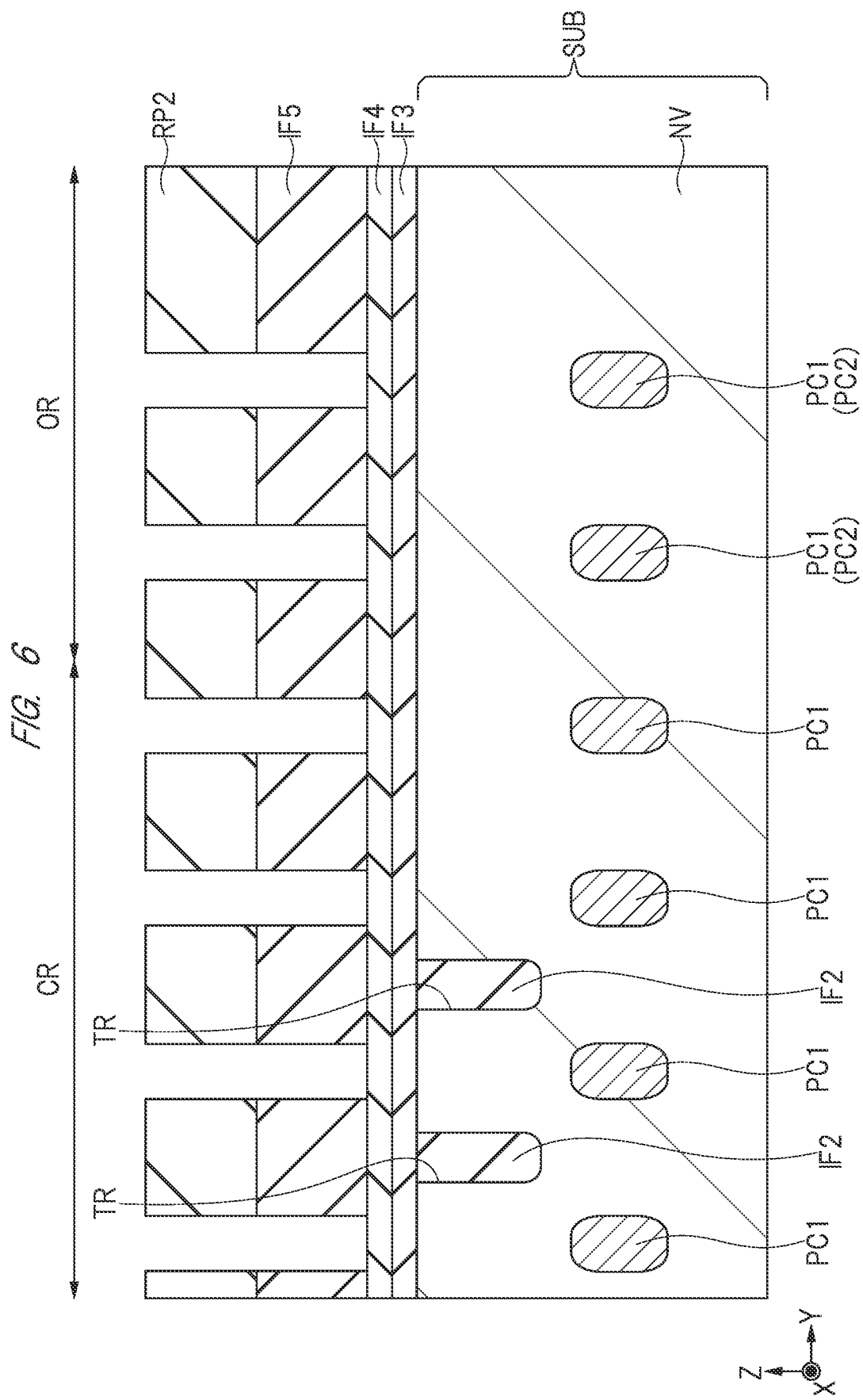
FIG. 6 is a cross-sectional view of the semiconductor device in the manufacturing process continued from FIG. 5.

As shown in FIG. 6, the p-type column region PC1 is formed in the drift region NV in the cell region CR and the outer peripheral region OR. First, an insulating film IF2 made of, for example, a silicon oxide film is formed on the semiconductor substrate SUB by, for example, the CVD method so as to fill the trench TR. Next, the insulating film IF2 located outside the pair of trenches TR is removed by, for example, a CMP method or the dry etching process.

Next, an insulating film IF3, an insulating film IF4, and an insulating film IF5 are formed on the semiconductor substrate SUB in this order by, for example, the CVD method. The insulating films IF3 and IF5 are, for example, silicon oxide films, and the insulating film IF4 is, for example, a silicon nitride film. Note that a thickness of the insulating film IF5 is thicker than a thickness of each of the insulating films IF3 and IF4.

Next, a resist pattern RP2 is formed on the insulating film IF5, and the dry etching process is performed using the resist pattern RP2 as a mask to selectively pattern the insulating film IF5 and form an opening in the insulating film IF5 that reaches the insulating film IF4. Next, ion implantation of, for example, boron (B) or the like is performed using the resist pattern RP2 and the insulating film IF5 as masks and using the insulating films IF3 and IF4 as protective films for protecting the surface of the semiconductor substrate SUB. As a result, the p-type column region PC1 is formed in the drift region NV located below the opening of the insulating film IF5.

Note that the column region PC1 formed in the drift region NV in the outer peripheral region OR is formed as a portion of the column region PC2. Subsequently, the resist pattern RP2 is removed by the ashing process.

Figure 7:
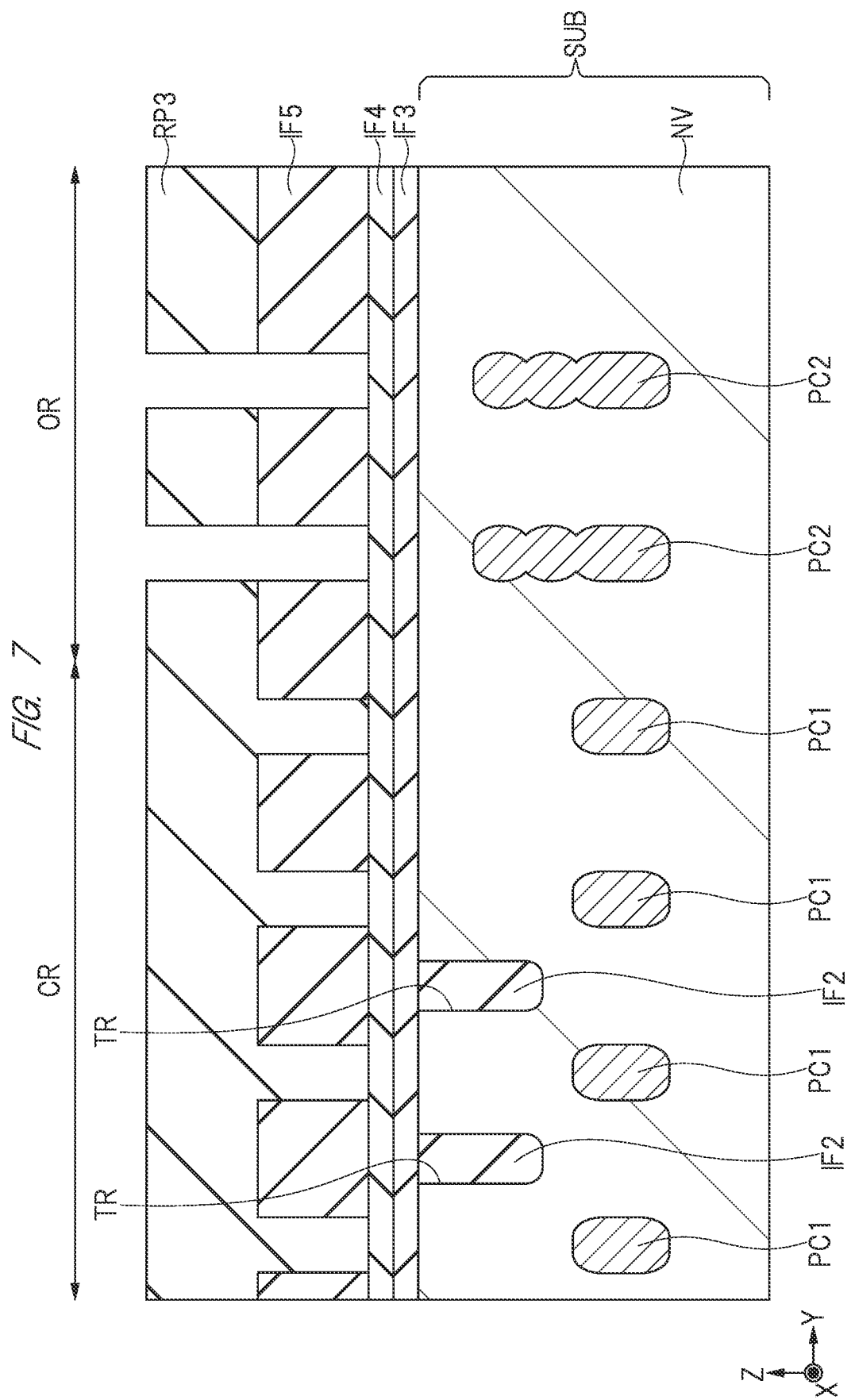
FIG. 7 is a cross-sectional view of the semiconductor device in the manufacturing process continued from FIG. 6.

As shown in FIG. 7, the p-type column region PC2 is formed in the drift region NV in the outer peripheral region OR. First, a resist pattern RP3 covering the opening of the insulating film IF5 in the cell region CR and having a pattern that exposes the opening of the insulating film IF5 in the outer peripheral region OR is formed on the insulating film IF5. Next, selective ion implantation of, for example, boron (B) or the like is performed on the outer peripheral region OR using the resist pattern RP3 and the insulating film IF5 as masks. As a result, a portion of the column region PC2 is formed in the drift region NV above the other portion of the column region PC2 (column region PC1).

Note that the ion implantation in FIG. 7 is performed at a lower implantation energy than in the ion implantation in FIG. 6, and is performed multiple times. The implantation energy is suitably adjusted such that the column region PC2 having a thickness that allows contact with the well region PW to be formed in a later step. Subsequently, the resist pattern RP3 is removed by the ashing process.

Figure 8:
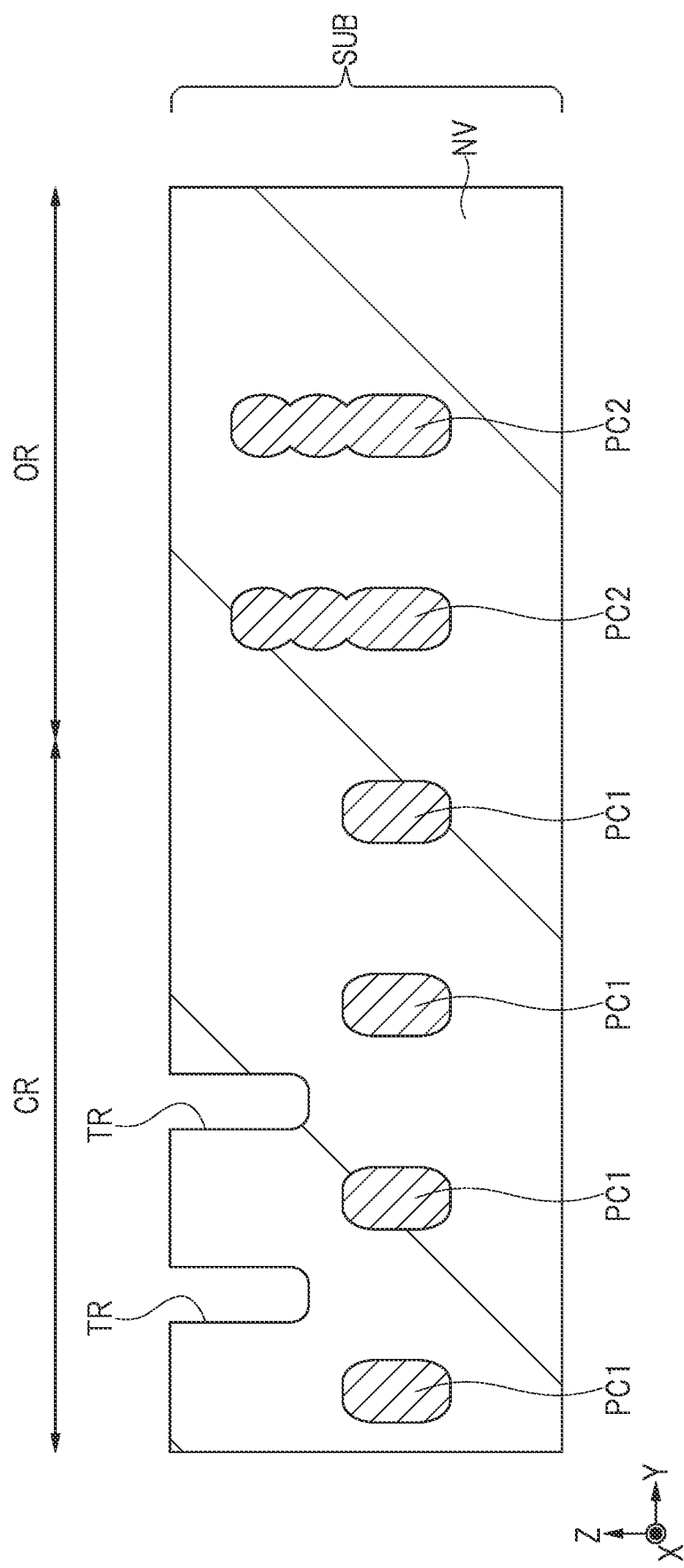
FIG. 8 is a cross-sectional view of the semiconductor device in the manufacturing process continued from FIG. 7.

As shown in FIG. 8, the insulating film IF5, the insulating film IF4, the insulating film IF3, and the insulating film IF2 are sequentially removed by the wet etching process. First, the insulating film IF5 is removed by the wet etching process using, for example, hydrofluoric acid. Next, the insulating film IF4 is removed by the wet etching process using, for example, phosphoric acid. Next, the insulating films IF3 and IF2 are removed by the wet etching process using, for example, hydrofluoric acid. As a result, the surface of the semiconductor substrate SUB including the inside of the trench TR is exposed.

Figure 9:
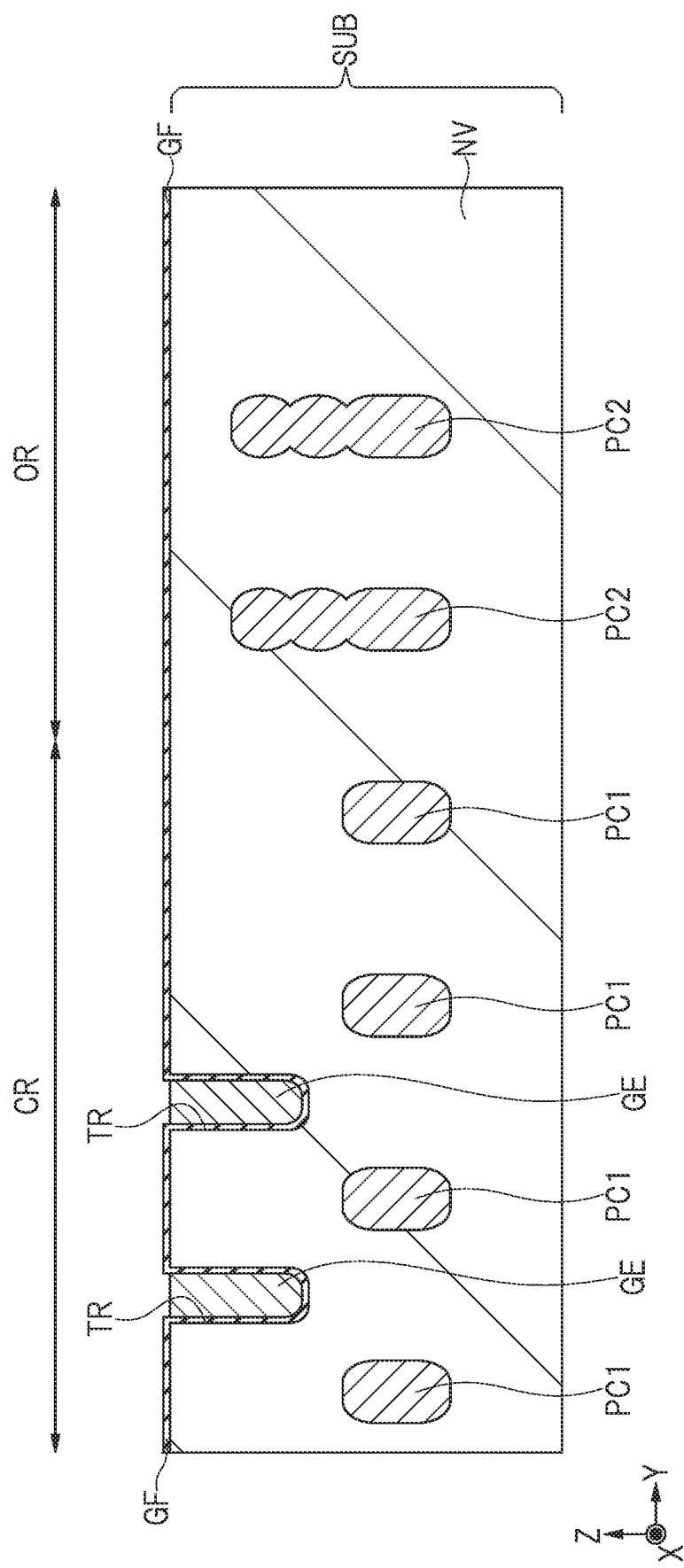
FIG. 9 is a cross-sectional view of the semiconductor device in the manufacturing process continued from FIG. 8.

As shown in FIG. 9, the gate electrode GE is formed in the trench TR with the gate insulating film GF interposed therebetween. First, the gate insulating film GF made of a silicon oxide film is formed on the semiconductor substrate SUB including the inside of the trench TR by, for example, a thermal oxidation method. Next, a polysilicon film in which, for example, n-type impurities are introduced is formed on the semiconductor substrate SUB by, for example, the CVD method so as to fill the trench TR with the gate insulating film GF interposed therebetween. Next, the polysilicon film located outside the trench TR is removed by, for example, the CMP method or the dry etching process.

Figure 10:
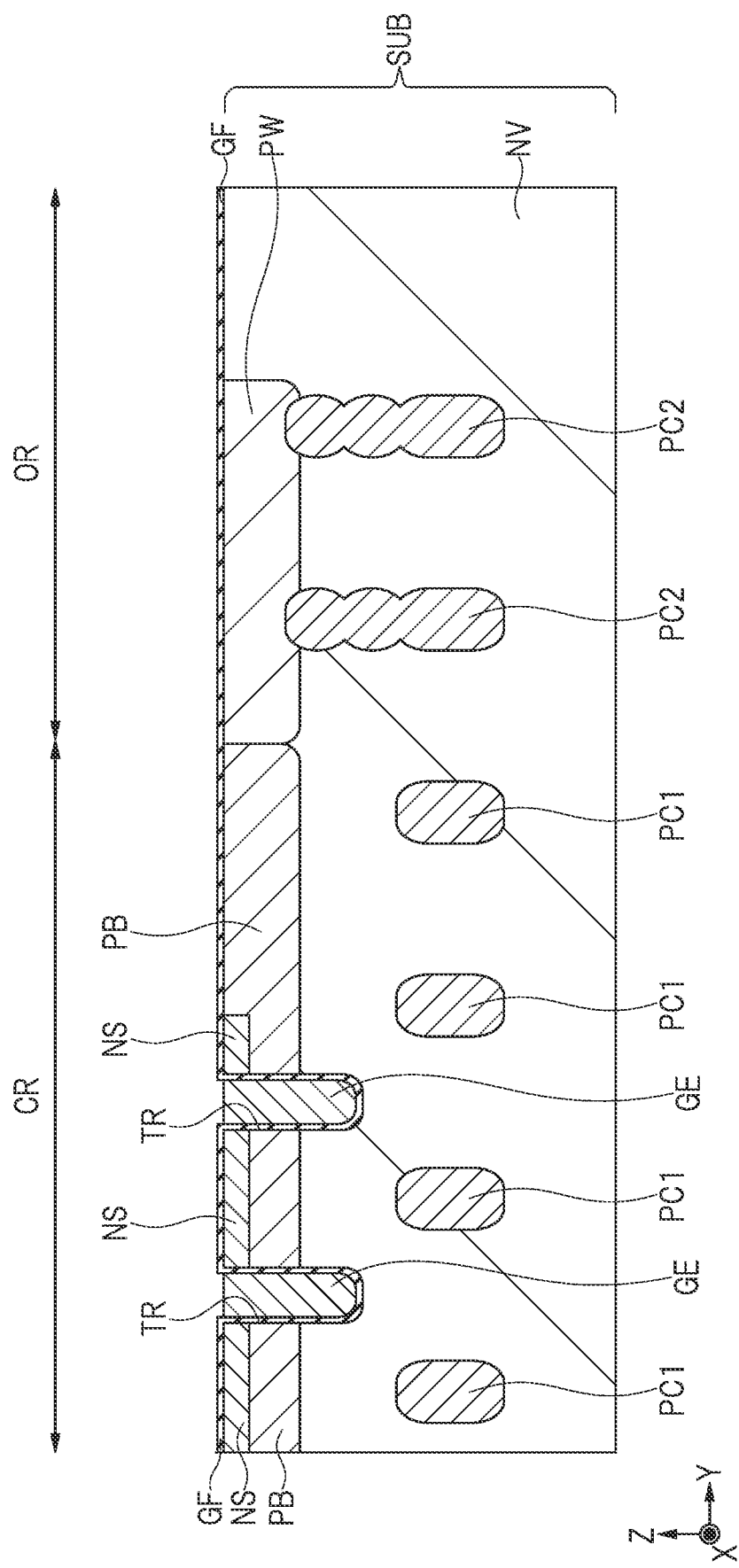
FIG. 10 is a cross-sectional view of the semiconductor device in the manufacturing process continued from FIG. 9.

As shown in FIG. 10, first, the p-type well region PW is formed by introducing boron (B) or the like to the surface of the drift region NV in the outer peripheral region OR by the photolithography method and the ion implantation method. Next, the p-type body region PB is formed by introducing boron (B) or the like to the surface of the drift region NV in the cell region CR by the photolithography method and ion implantation method. Next, the n-type source region NS is formed by introducing arsenic (As) or the like to the surface of the body region PB by the photolithography method and the ion implantation method.

Figure 11:
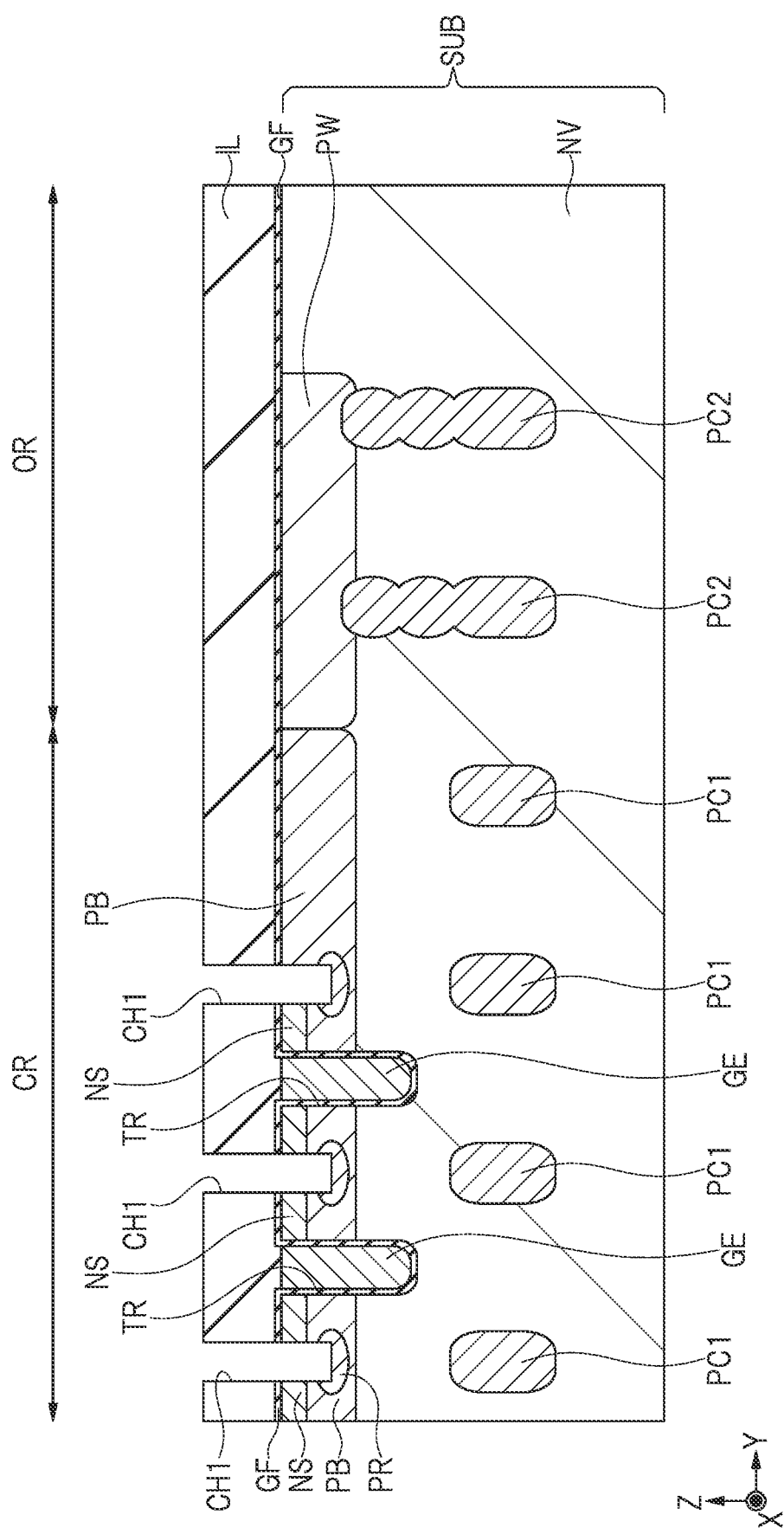
FIG. 11 is a cross-sectional view of the semiconductor device in the manufacturing process continued from FIG. 10.

As shown in FIG. 11, the interlayer insulating film IL is formed on the semiconductor substrate SUB, the hole CH1 is formed in the interlayer insulating film IL in the cell region CR, and the high concentration region PR is formed in the body region PB. First, the interlayer insulating film IL made of, for example, a silicon oxide film is formed on the semiconductor substrate SUB by, for example, the CVD method so as to cover the gate electrode GE. Next, the hole CH1 penetrating the interlayer insulating film IL and the source region NS is formed by the photolithography method and the dry etching process. The bottom portion of the hole CH1 is located in the body region PB. Next, at the bottom portion of the hole CH1, ion implantation of boron (B) or the like is performed on the inside of the body region PB such that the p-type high concentration region PR having a higher impurity concentration than the body region PB is formed.

Subsequently, although not shown, the hole CH2 is formed in a portion of the interlayer insulating film IL located on a portion of the gate electrode GE set in the gate lead portion by the photolithography method and the dry etching process.

Figure 12:
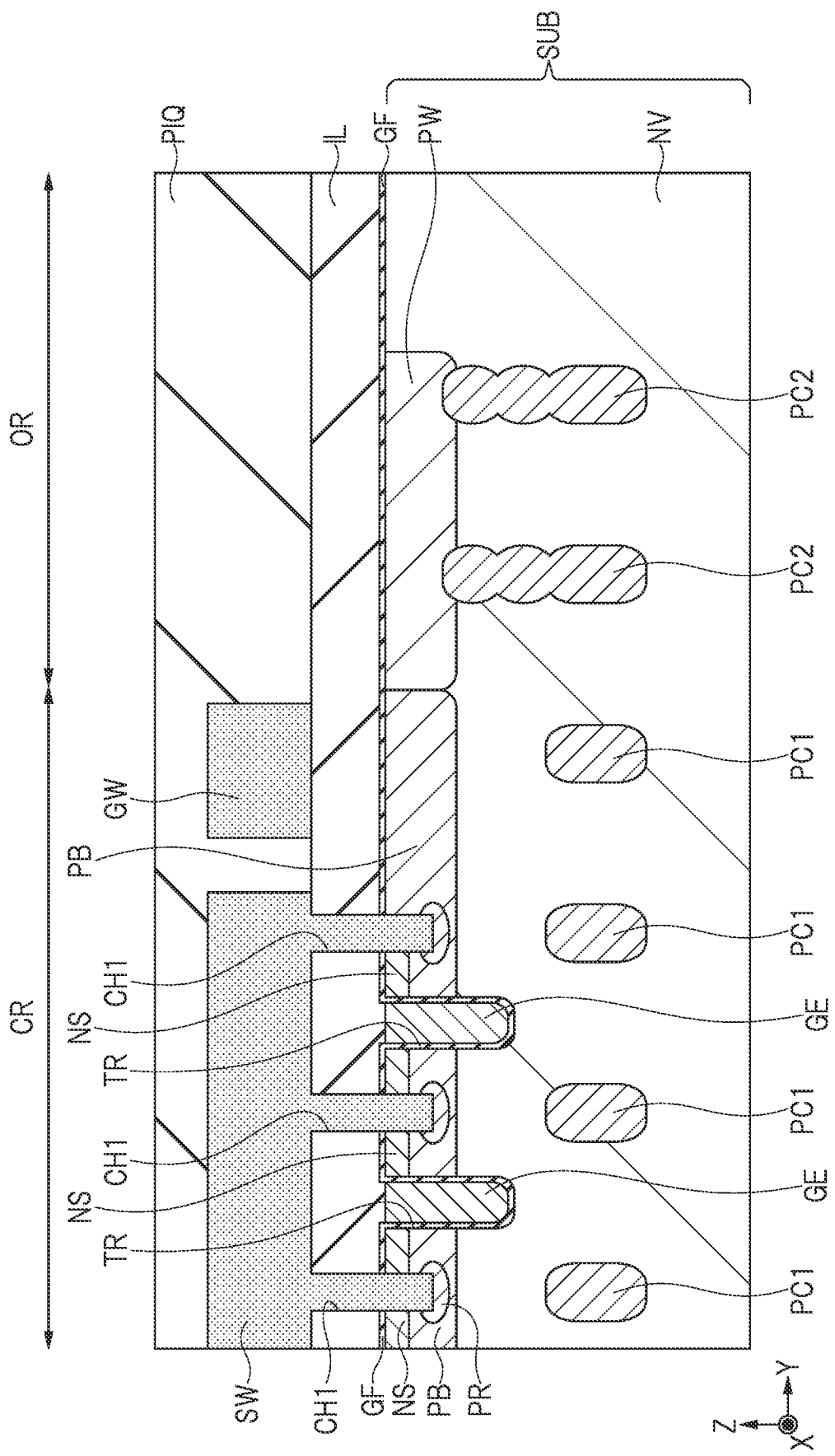
FIG. 12 is a cross-sectional view of the semiconductor device in the manufacturing process continued from FIG. 11.

As shown in FIG. 12, the source wiring SW is formed on the interlayer insulating film IL, and the protective film PIQ is formed on the source wiring SW. First, a stacked film including a barrier metal film made of, for example, a titanium nitride film, and a conductive film made of, for example, an aluminum film is formed on the interlayer insulating film IL by a sputtering method or the CVD method so as to fill the hole CH1. Next, the source wiring SW is formed by patterning the stacked film. Although not shown here, the gate wiring GW is also formed on the interlayer insulating film IL in the same step as forming the source wiring SW so as to fill the hole CH2. Next, the protective film PIQ made of, for example, a polyimide film is formed on the source wiring SW and on the gate wiring GW by, for example, a coating method. Subsequently, although not shown, a portion of the protective film PIQ is opened to expose regions on the source wiring SW and on the gate wiring GW that respectively become the source pad and the gate pad.

After FIG. 12, first, the rear surface of the semiconductor substrate SUB is polished as necessary. Next, the n-type drain region ND is formed by introducing, for example, arsenic (As) or the like to the rear surface of the semiconductor substrate SUB by ion implantation. Next, the drain electrode DE is formed on the drain region ND by the sputtering method.

Through the above-described steps, the semiconductor device 100 shown in FIG. 3 is manufactured.

Modification Example

Hereinafter, a method of manufacturing the semiconductor device according to a modification example will be described with reference to FIGS. 13 to 17. Note that, in the following description, differences from the first embodiment will be mainly described, and descriptions redundant with those of the first embodiment are omitted as appropriate.

In the modification example, the order in which each component such as the column region PC1 is manufactured differs from that of the first embodiment. However, the steps of manufacturing each component themselves are substantially the same as those of the first embodiment. Therefore, the order of which each component is manufactured will be mainly described below, and detailed descriptions of the steps themselves will be omitted as appropriate.

Figure 13:
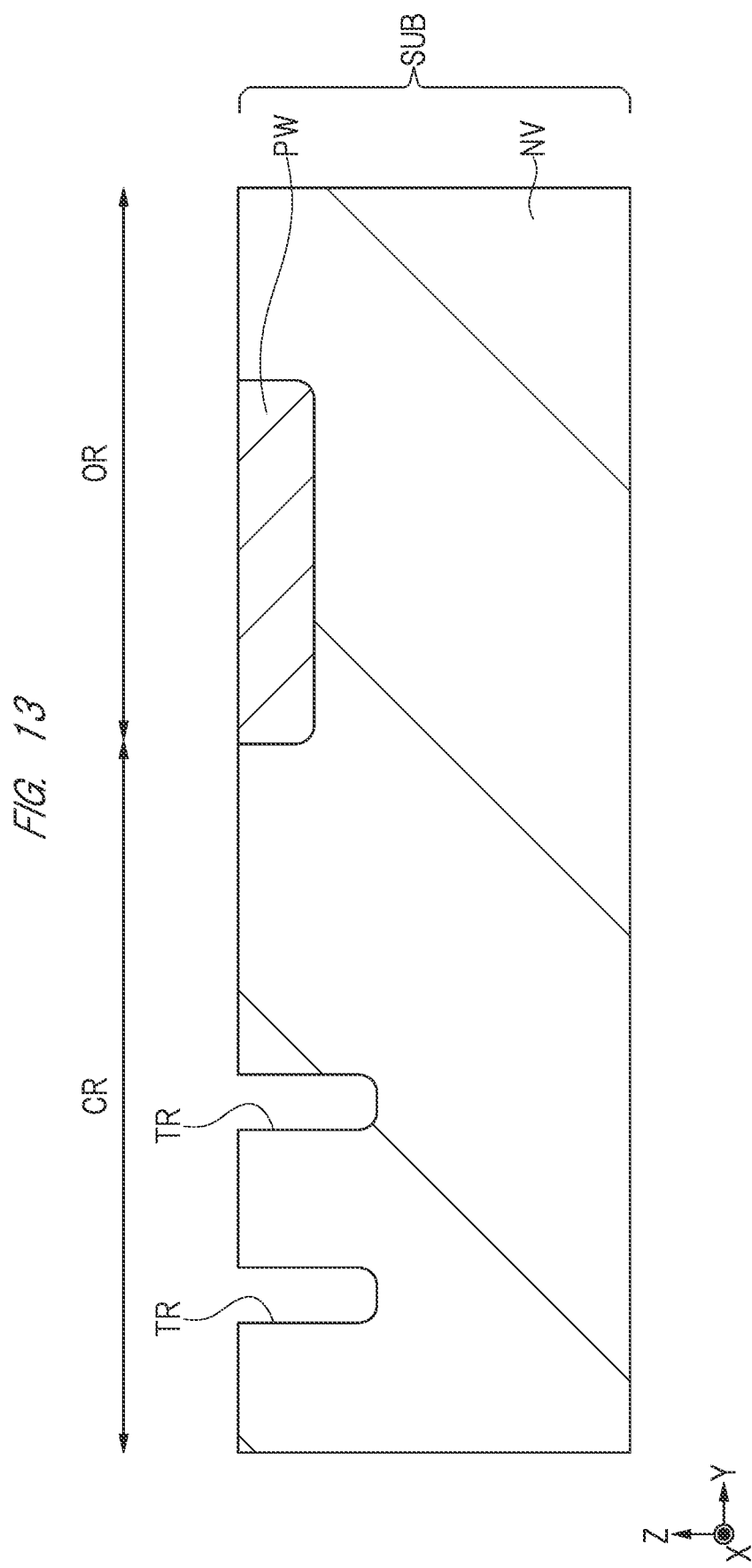
FIG. 13 is a cross-sectional view of the semiconductor device in a manufacturing process according to a modification example.

The method of manufacturing the semiconductor device according to the modification example is the same as that in the first embodiment up to FIG. 5. After the step of FIG. 5, as shown in FIG. 13, the well region PW is formed on the surface of the drift region NV in the outer peripheral region OR. Next, the trench TR is formed in the drift region NV in the cell region CR.

Figure 14:
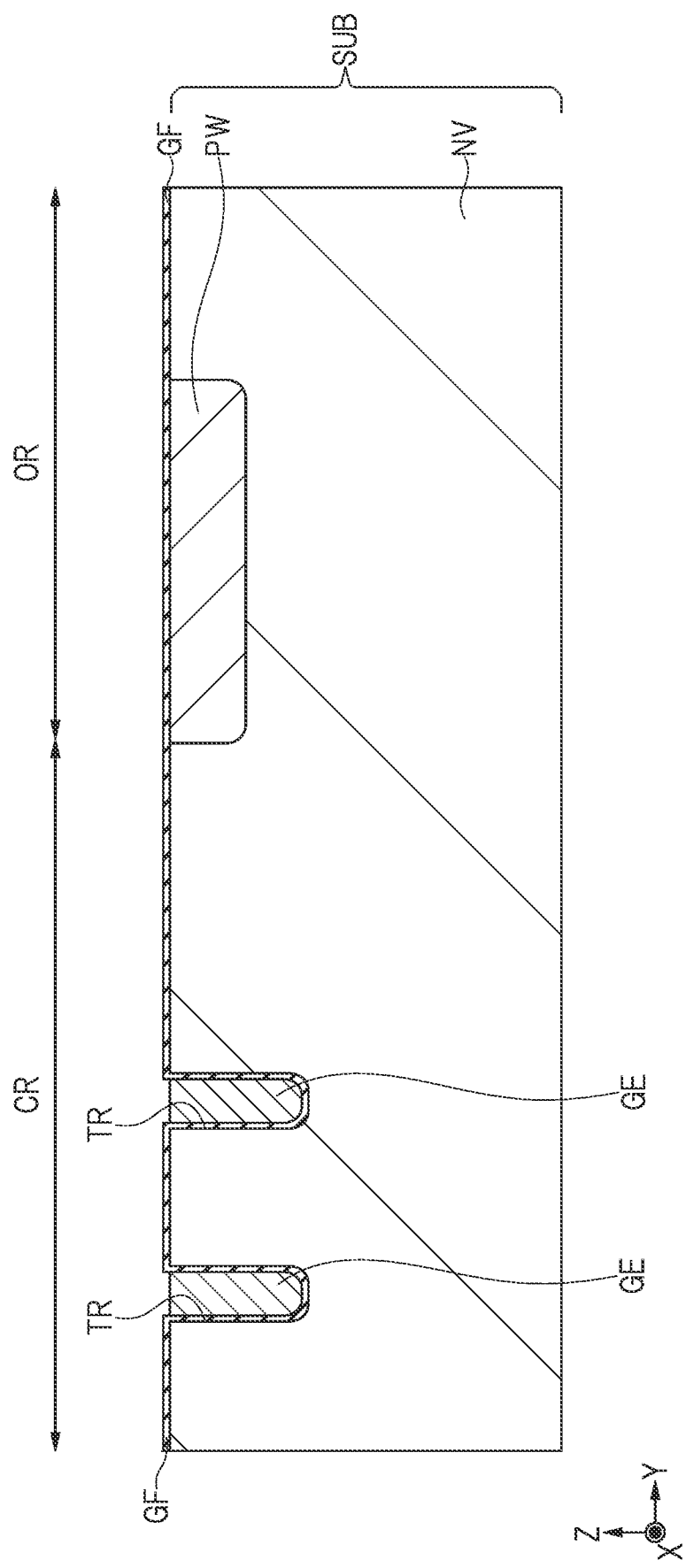
FIG. 14 is a cross-sectional view of the semiconductor device in the manufacturing process continued from FIG. 13.
Figure 15:
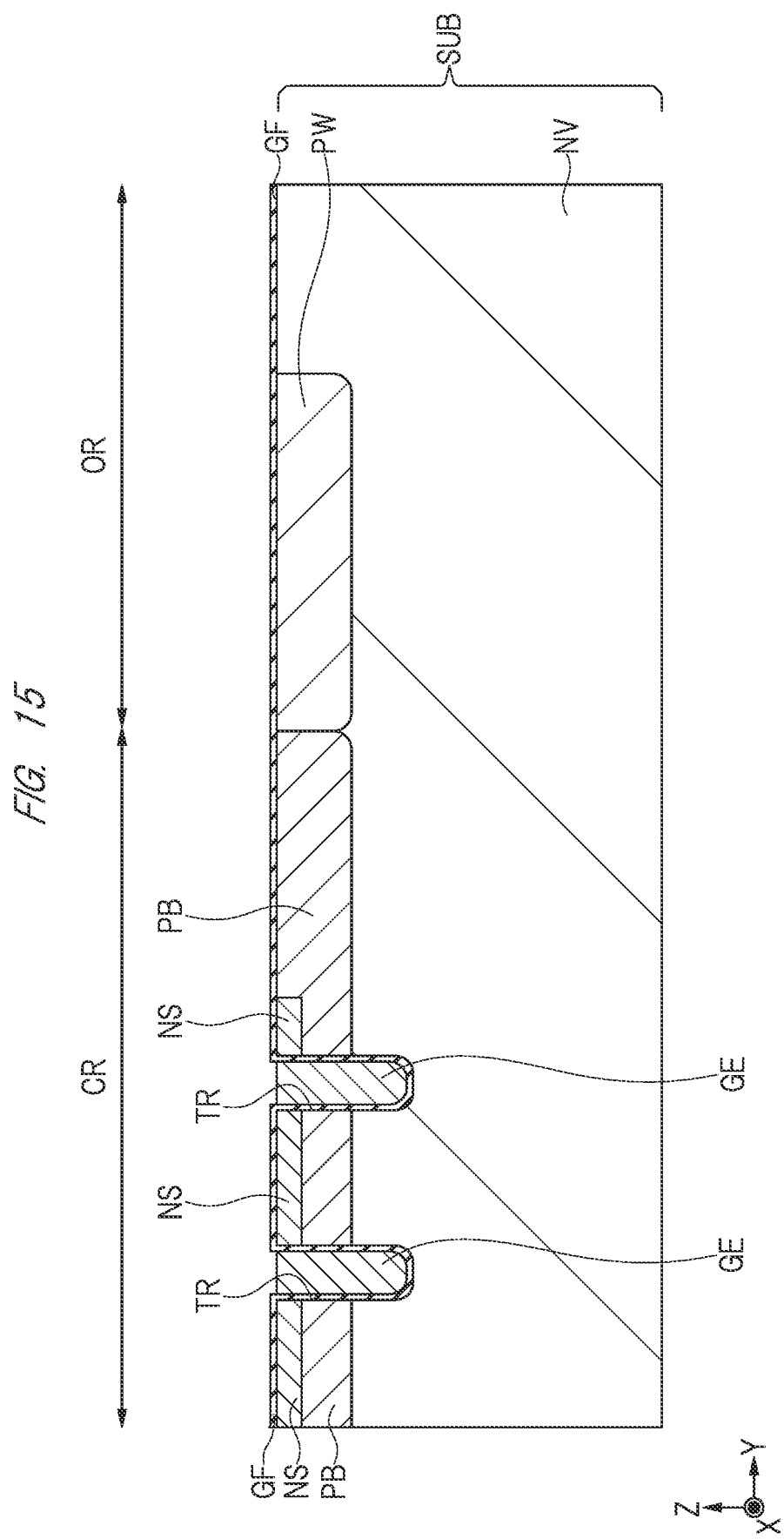
FIG. 15 is a cross-sectional view of the semiconductor device in the manufacturing process continued from FIG. 14.

Next, as shown in FIG. 14, the gate electrode GE is formed in the trench TR with the gate insulating film GF interposed therebetween. Next, as shown in FIG. 15, the body region PB is formed on the surface of the drift region NV in the cell region CR, and the source region NS is formed on the surface of the body region PB.

Figure 16:
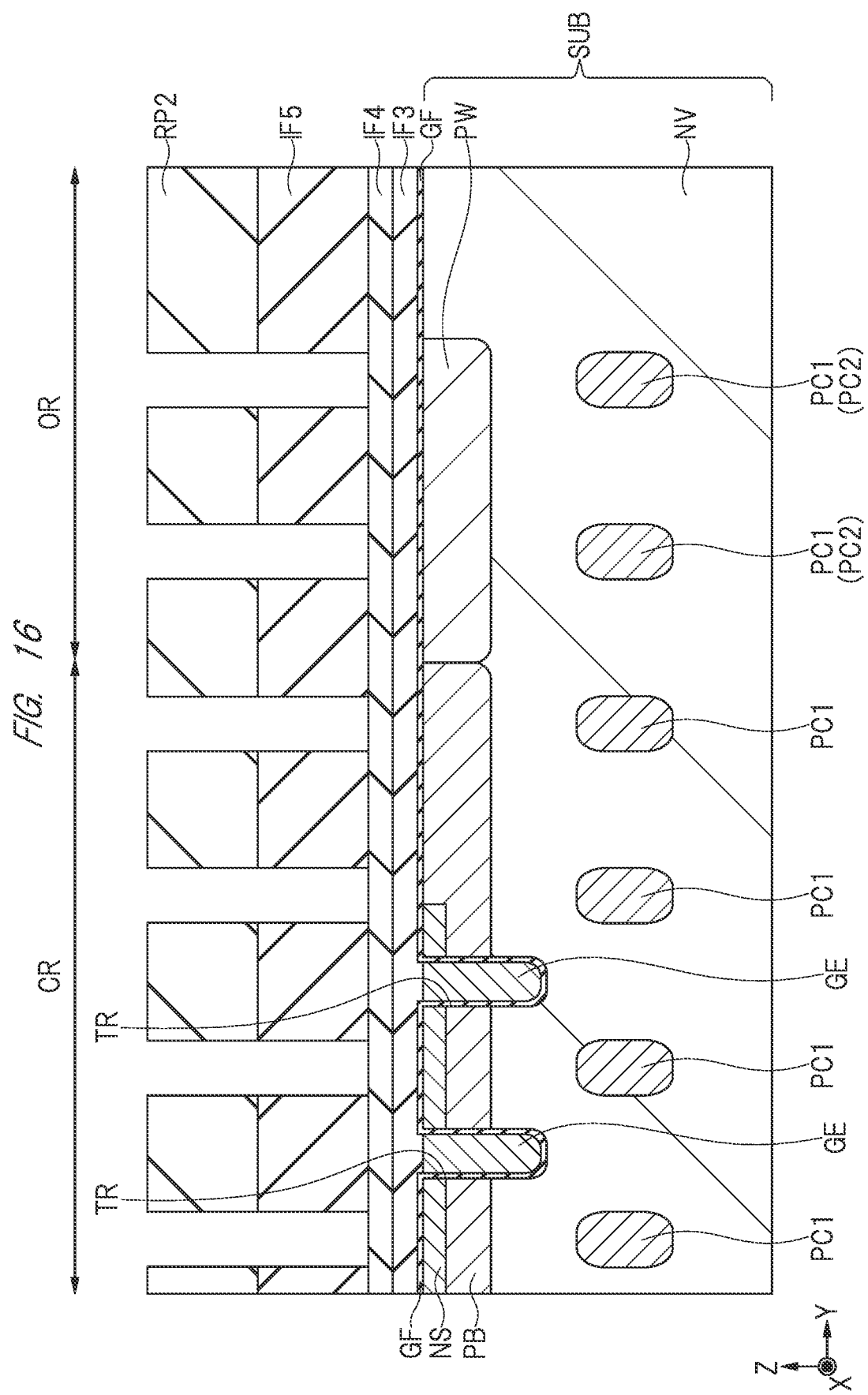
FIG. 16 is a cross-sectional view of the semiconductor device in the manufacturing process continued from FIG. 15.

Next, as shown in FIG. 16, the insulating film IF3, the insulating film IF4, and the insulating film IF5 are formed on the gate insulating film GF on the semiconductor substrate SUB in this order by, for example, the CVD method. Next, the resist pattern RP2 is formed on the insulating film IF5, and the dry etching process is performed using the resist pattern RP2 as a mask to selectively pattern the insulating film IF5 and form an opening in the insulating film IF5 that reaches the insulating film IF4.

Next, ion implantation of, for example, boron (B) or the like is performed using the resist pattern RP2 and the insulating film IF5 as masks. As a result, the p-type column region PC1 is formed in the drift region NV located below the opening of the insulating film IF5. As in the first embodiment, the column region PC1 formed in the drift region NV in the outer peripheral region OR is formed as a portion of the column region PC2. Subsequently, the resist pattern RP2 is removed by the ashing process.

Figure 17:
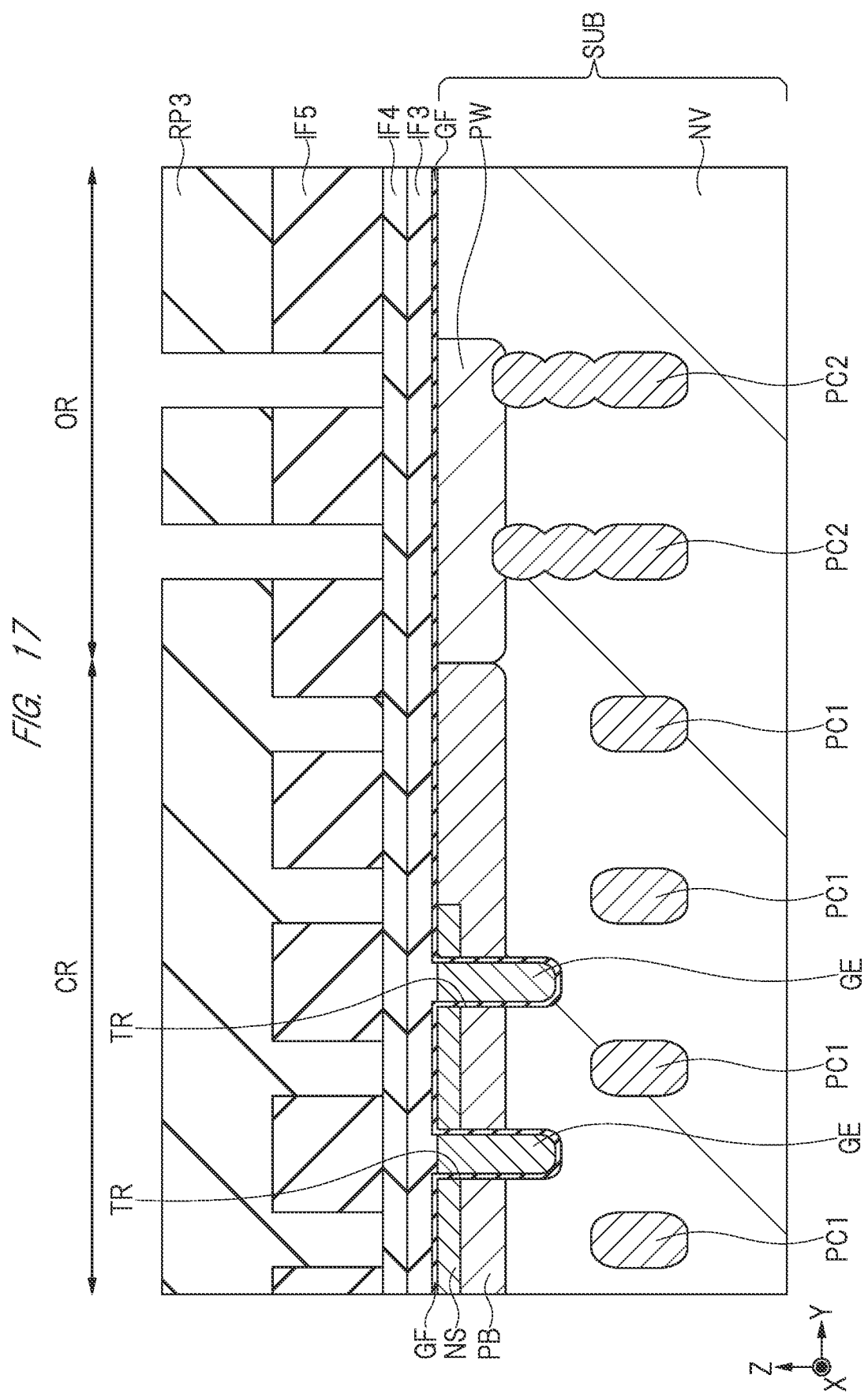
FIG. 17 is a cross-sectional view of the semiconductor device in the manufacturing process continued from FIG. 16.

Next, as shown in FIG. 17, the resist pattern RP3 similar to that of the first embodiment is formed on the insulating film IF5. Next, selective ion implantation of, for example, boron (B) or the like is performed on the outer peripheral region OR using the resist pattern RP3 and the insulating film IF5 as masks. As a result, a portion of the column region PC2 is formed in the drift region NV above the other portion of the column region PC2 (column region PC1).

Subsequently, the resist pattern RP3 is removed by the ashing process, and the insulating film IF5, the insulating film IF4, and the insulating film IF3 are sequentially removed by the wet etching process. Here, the gate insulating film GF on the semiconductor substrate SUB may be removed together with the insulating film IF3, or may be left as is. In addition, the insulating film IF3 may be left as is without being removed.

Subsequently, the steps after FIG. 11 described in the first embodiment are performed. In this manner, the semiconductor device 100 shown in FIG. 3 can be manufactured by the method of manufacturing the semiconductor device according to the modification example.

Second Embodiment

Hereinafter, the semiconductor device 100 according to a second embodiment will be described with reference to FIG. 18. Note that, in the following description, differences from the first embodiment will be mainly described, and descriptions redundant with those of the first embodiment are omitted as appropriate.

Figure 18:
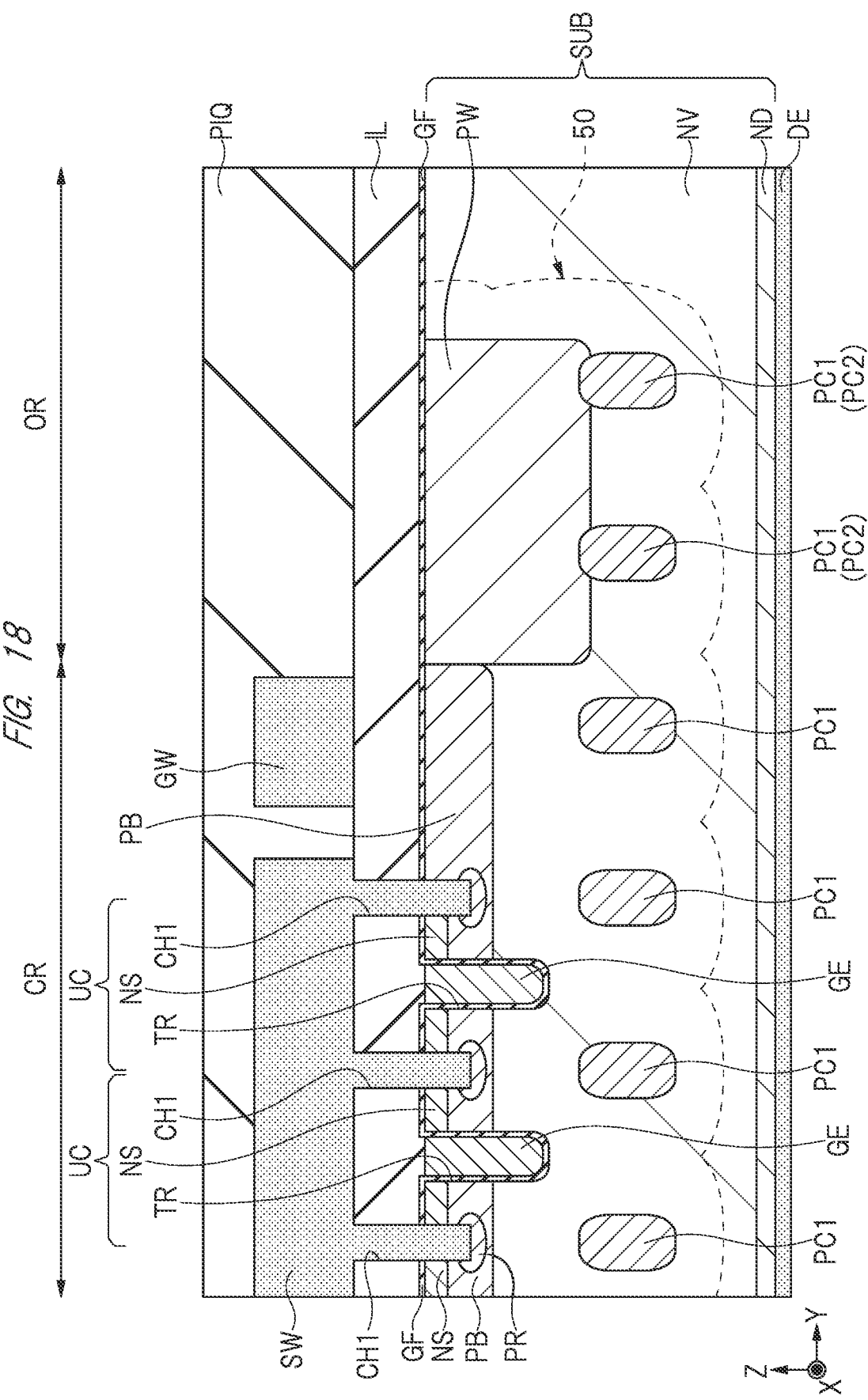
FIG. 18 is a cross-sectional view of the semiconductor device according to a second embodiment.

As shown in FIG. 18, the column region PC2 in the second embodiment has the same configuration as the column region PC1, and is formed by the same ion implantation as the column region PC1. Thus, the thickness of the column region PC2 is the same as the thickness of the column region PC1 in the cell region CR. However, in the second embodiment, a thickness of the well region PW is thicker than a thickness of the body region PB. Thus, in the second embodiment, the column region PC2 is connected to the well region PW. Therefore, since the spreading of the depletion layer 50 is sufficient, it is possible to ensure breakdown voltage in the outer peripheral region OR, whereby it is possible to ensure reliability of the semiconductor device 100.

Note that the well region PW in the second embodiment can be formed by performing ion implantation for the well region PW multiple times such that each implantation energy differs. The well region PW is formed in this manner, and thus, in the second embodiment, there is no need to add a new mask to form the well region PW.

In addition, the column region PC2 is formed by the same ion implantation as the column region PC1 using the resist pattern RP2 shown in FIG. 6, and thus, ion implantation using the resist pattern RP3 shown in FIG. 7 can be omitted. Therefore, in the second embodiment, the manufacturing process can be simplified compared to the first embodiment.

Third Embodiment

Hereinafter, the semiconductor device 100 according to a third embodiment will be described with reference to FIGS. 19 to 21. Note that, in the following description, differences from the first embodiment will be mainly described, and descriptions redundant with those of the first embodiment are omitted as appropriate.

Figure 19:
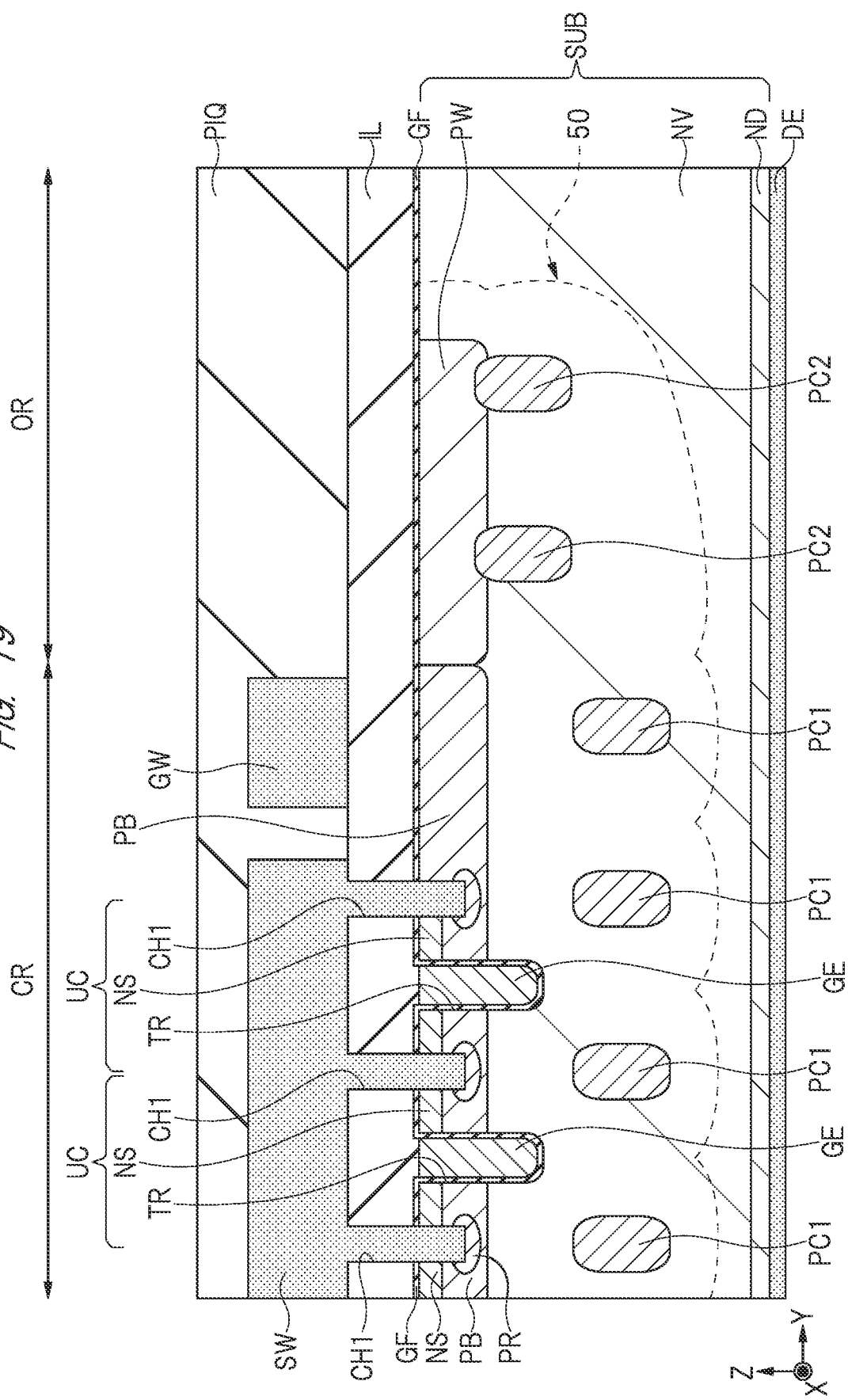
FIG. 19 is a cross-sectional view of the semiconductor device according to a third embodiment.

As shown in FIG. 19, in the third embodiment, the thickness of the column region PC2 is substantially the same as the thickness of the column region PC1 in the cell region CR. However, a position of a bottom portion of the column region PC2 is shallower than a position of a bottom portion of the column region PC1. In the third embodiment, the column region PC2 is connected to the well region PW. Therefore, since the spreading of the depletion layer 50 is sufficient, it is possible to ensure breakdown voltage in the outer peripheral region OR, whereby it is possible to ensure reliability of the semiconductor device 100.

The column region PC2 in the third embodiment is formed by the same ion implantation as the column region PC1. This ion implantation is performed in a state where the stacked film including the insulating films IF3 and IF4 formed on the drift region NV is formed. In the third embodiment, a thickness of the stacked film in the outer peripheral region OR differs from a thickness of the stacked film in the cell region CR, and is thicker than the thickness of the stacked film in the cell region CR. Thus, when the same ion implantation is performed on the outer peripheral region OR and the cell region CR, the location of the bottom portion of the column region PC2 in the outer peripheral region OR becomes shallower than the location of the bottom portion of the column region PC1 in the cell region CR.

Figure 20:
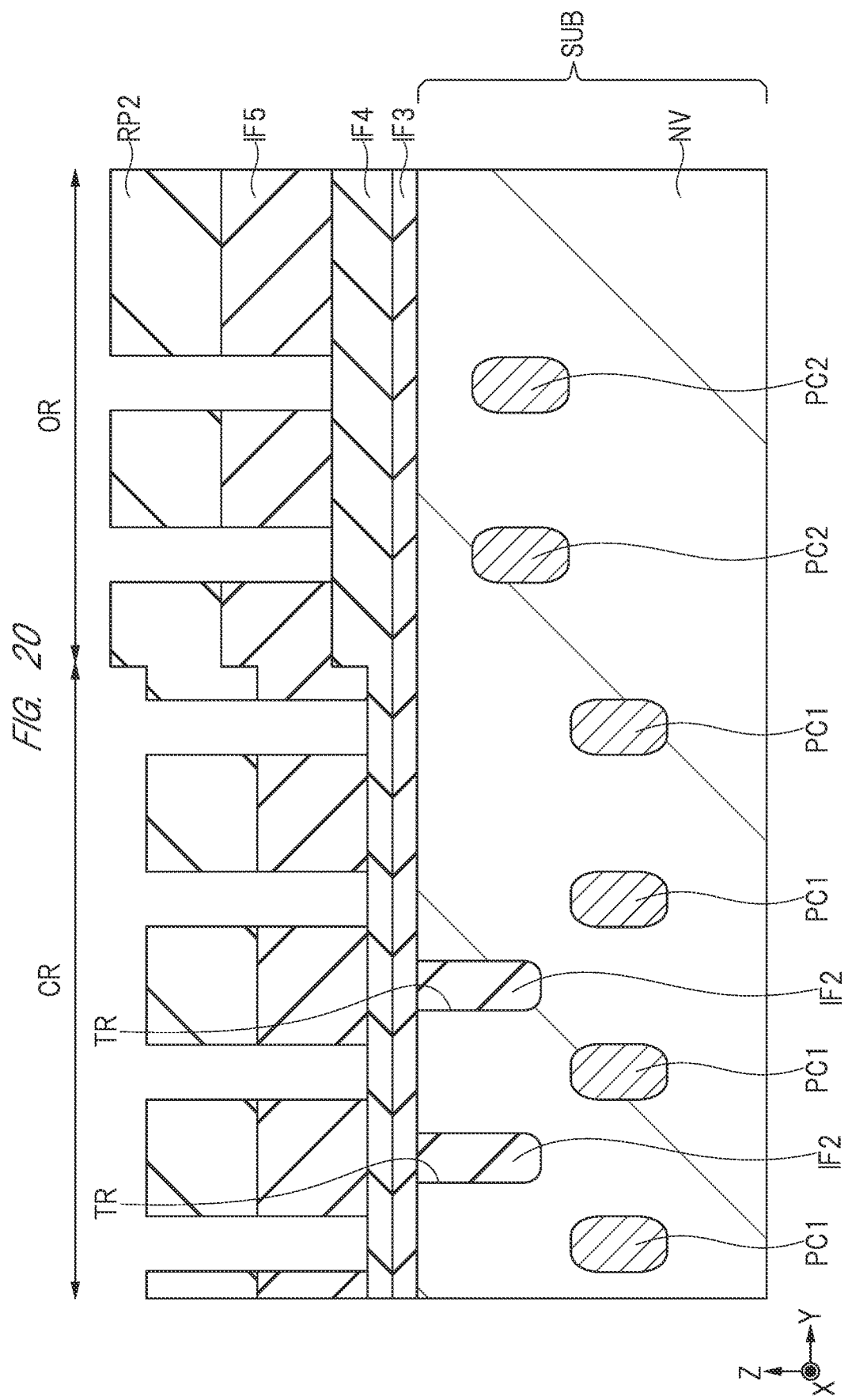
FIG. 20 is a cross-sectional view of the semiconductor device according to the third embodiment in an example of a manufacturing process.
Figure 21:
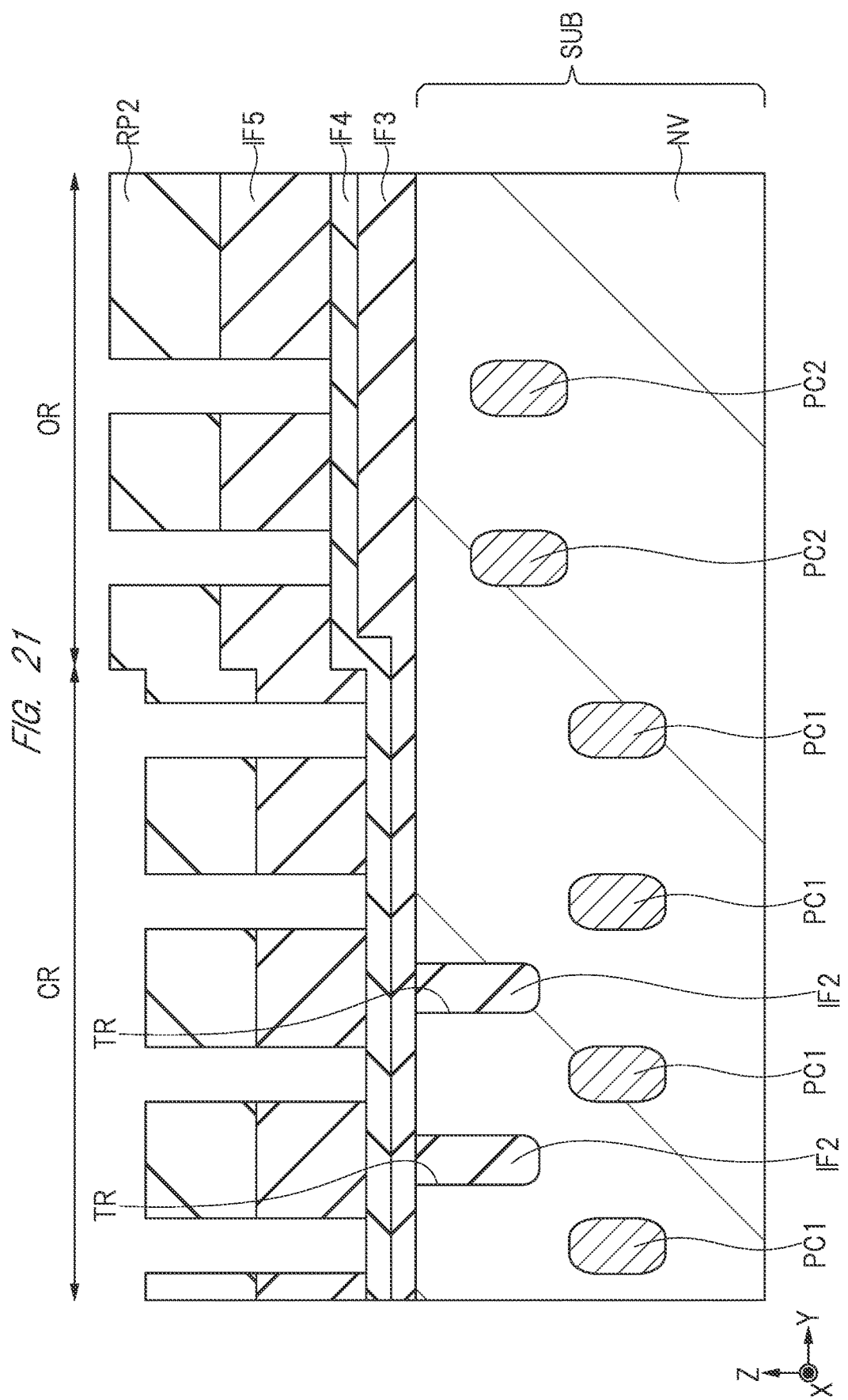
FIG. 21 is a cross-sectional view of the semiconductor device according to the third embodiment in another example of the manufacturing process.

Such ion implantation is performed in a state shown in FIG. 20 or 21 instead of FIGS. 6 and 7 of the first embodiment.

In FIG. 20, the thickness of the insulating film IF4 in the outer peripheral region OR is thicker than the thickness of the insulating film IF4 in the cell region CR. To achieve such a state, the insulating film IF4 having a thicker thickness than in the first embodiment is formed, and thereafter, the thickness of the insulating film IF4 in the cell region CR is selectively thinned by the photolithography method and the dry etching process. Subsequently, as in the first embodiment, the insulating film IF5 and the resist pattern RP2 are formed, the opening is formed in the insulating film IF5, and thereafter, ion implantation is performed.

In FIG. 21, the thickness of the insulating film IF3 in the outer peripheral region OR is thicker than the thickness of the insulating film IF3 in the cell region CR. To achieve such a state, the insulating film IF3 having a thicker thickness than in the first embodiment is formed, and thereafter, the thickness of the insulating film IF3 in the cell region CR is selectively thinned by the photolithography method and the dry etching process. Subsequently, as in the first embodiment, the insulating film IF4, the insulating film IF5, and the resist pattern RP2 are formed, the opening is formed in the insulating film IF5, and thereafter, ion implantation is performed.

Note that, in a case where such ion implantation is applied to the manufacturing method of the modification example, a technical concept shown in FIG. 20 or 21 may be applied instead of those of FIGS. 16 and 17 in the modification example.

Fourth Embodiment

Figure 22:
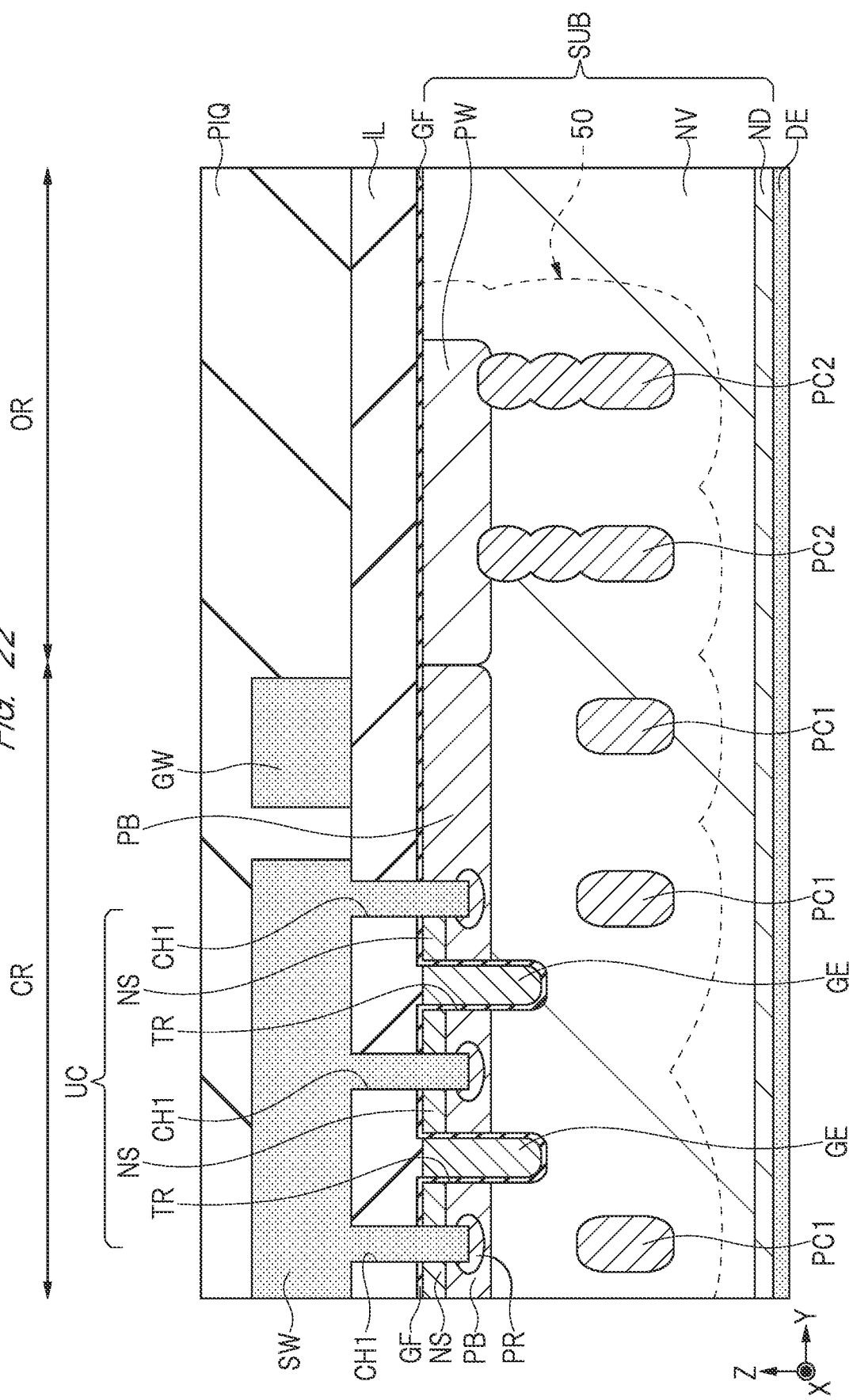
FIG. 22 is a cross-sectional view of the semiconductor device according to a fourth embodiment.

Hereinafter, the semiconductor device 100 according to a fourth embodiment will be described with reference to FIG. 22. Note that, in the following description, differences from the first embodiment will be mainly described, and descriptions redundant with those of the first embodiment are omitted as appropriate.

Each of the unit cells UC of the fourth embodiment constitutes a multi-trench SJ structure having the pair of trenches TR and the pair of gate electrodes GE. The pair of trenches TR are located between the pair of column regions PC1 in the Y direction, but no column region PC1 is provided between the pair of trenches TR. Applying such a unit cell UC to the cell region CR makes it possible to reduce a normalized ON-resistance (Rsp) (see Patent Document 1). In addition, in the fourth embodiment, it is possible to ensure breakdown voltage in the outer peripheral region OR, whereby it is possible to ensure reliability of the semiconductor device 100.

Note that the unit cell UC of the multi-trench SJ structure disclosed in the fourth embodiment can be applied to the second or third embodiment.

In the foregoing, the present invention has been concretely described based on the embodiments. However, the present invention is not limited to the foregoing embodiments, and various modifications and alterations can be made within the scope of the present invention.

What is claimed is:

1. A semiconductor device including a cell region in which a plurality of unit cells are formed, and an outer peripheral region surrounding the cell region in plan view,
wherein each of the plurality of unit cells comprises:
a semiconductor substrate having a drift region made of a semiconductor layer of a first conductivity type;
a body region of a second conductivity type opposite to the first conductivity type, the body region being formed on a surface of the drift region in the cell region;
a source region of the first conductivity type formed on a surface of the body region;
a pair of first column regions of the second conductivity type formed in the drift region below the body region so as to be physically separated from the body region, the pair of first column regions being apart from and adjacent to each other in a first direction in plan view;
a trench formed in the drift region such that a bottom portion of the trench reaches a position deeper than the body region, the trench being formed between the pair of first column regions in the first direction;
a gate electrode formed in the trench with a gate insulating film interposed therebetween;
an interlayer insulating film formed on the semiconductor substrate so as to cover the gate electrode;
a pair of first holes penetrating the interlayer insulating film and the source region such that a bottom portion of each of the first holes is located in the body region, the pair of first holes being provided at a position overlapping the pair of column regions in plan view; and
a source wiring formed on the interlayer insulating film so as to fill the pair of first holes,
wherein a first impurity region of the second conductivity type is formed on the surface of the drift region in the outer peripheral region,
wherein a second column region of the second conductivity type is formed in the drift region below the first impurity region, the second column region extending in the first direction and in a second direction intersecting the first direction in plan view so as to surround the cell region,
wherein the first impurity region is in contact with the body region,
wherein the second column region is connected to the first impurity region, and
wherein the second column region is electrically connected to the source wiring via the body region and the first impurity region.

2. The semiconductor device according to claim 1, wherein a thickness of the second column region is thicker than a thickness of the pair of first column regions.

3. The semiconductor device according to claim 1, wherein a thickness of the first impurity region is thicker than a thickness of the body region.

4. The semiconductor device according to claim 1, wherein a position of a bottom portion of the second column region is shallower than a position of a bottom portion of the pair of first column regions.

5. The semiconductor device according to claim 1,
wherein an impurity concentration of the first impurity region is lower than an impurity concentration of the body region, and
wherein an impurity concentration of each of the second column region and the pair of first column regions is higher than an impurity concentration of each of the first impurity region and the body region.

6. The semiconductor device according to claim 1,
wherein the first conductivity type is of an n-type, and
wherein the second conductivity type is of a p-type.

7. A method of manufacturing a semiconductor device including a cell region in which a plurality of unit cells are formed and an outer peripheral region surrounding the cell region in plan view, the method comprising:
(a) preparing a semiconductor substrate having a drift region made of a semiconductor layer of a first conductivity type;
(b) forming a trench in the drift region in the cell region;
(c) after the (b), performing an ion implantation to form a pair of first column regions of a second conductivity type opposite to the first conductivity type and a portion of a second column region of the second conductivity type, the pair of first column regions being formed in the drift region in the cell region so as to be apart from and adjacent to each other in a first direction in plan view, the portion of the second column region being formed in the drift region in the outer peripheral region;
(d) after the (c), forming a resist pattern on the semiconductor substrate, the resist pattern covering the semiconductor substrate in the cell region and exposing the semiconductor substrate in the outer peripheral region;
(e) after the (d), performing an ion implantation using the resist pattern as a mask to form another portion of the second column region in the drift region in the outer peripheral region, the second column region including the portion of the second column region and the another portion of the second column region, the second column region extending in the first direction and in a second direction intersecting the first direction in plan view so as to surround the cell region, and forming a gate electrode in the trench with a gate insulating film interposed therebetween;
(f) forming a body region of the second conductivity type on a surface of the drift region in the cell region;
(g) forming a source region of the first conductivity type on a surface of the body region; and
(h) forming a first impurity region of the second conductivity type on a surface of the drift region in the outer peripheral region,
wherein the trench is formed between the pair of first column regions in the first direction,
wherein a bottom portion of the trench reaches a position deeper than the body region,
wherein each of the plurality of unit cells comprises the semiconductor substrate, the drift region, the trench, the pair of first column regions, the gate insulating film, the gate electrode, the body region, and the source region, wherein the pair of first column regions is formed in the drift region below the body region so as to be physically separated from the body region, wherein the first impurity region is connected to the body region, and wherein the second column region is formed in the drift region below the first impurity region and is connected to the first impurity region.

8. The method according to claim 7, wherein the (c) and the (d) are performed by the same ion implantation, and wherein a thickness of the first impurity region formed in the (h) is thicker than a thickness of the body region formed in the (f).

9. The method according to claim 7, wherein the (c) and the (d) are performed by the same ion implantation in a state where a stacked film including a first insulating film and a second insulating film is formed on the drift region in each of the cell region and the outer peripheral region, and wherein a thickness of the stacked film in the outer peripheral region is thicker than a thickness of the stacked film in the cell region.

10. The method according to claim 7, further comprising:

(i) forming an interlayer insulating film on the semiconductor substrate so as to cover the gate electrode;

(j) forming a pair of first holes penetrating the interlayer insulating film and the source region such that a bottom portion of each of the first holes is located in the body region; and (k) forming a source wiring on the interlayer insulating film so as to fill the pair of first holes, wherein the pair of first holes is provided at a position overlapping the pair of column regions in plan view, wherein each of the plurality of unit cells further comprises the interlayer insulating film, the pair of first holes, and the source wiring, and wherein the second column region is electrically connected to the source wiring via the body region and the first impurity region.

11. The method according to claim 7, wherein an impurity concentration of the first impurity region is lower than an impurity concentration of the body region, and wherein an impurity concentration of each of the second column region and the pair of first column regions is higher than an impurity concentration of each of the first impurity region and the body region.

12. The method according to claim 7, wherein the first conductivity type is of an n-type, and wherein the second conductivity type is of a p-type.

* * * * *